United States Patent
Kinugawa et al.

(10) Patent No.: US 12,459,788 B2
(45) Date of Patent: Nov. 4, 2025

(54) ARTICLE TRANSPORT VEHICLE

(71) Applicant: Daifuku Co., Ltd., Osaka (JP)

(72) Inventors: Tomotaka Kinugawa, Hinocho (JP); Hiroshi Otsuka, Hinocho (JP); Keisuke Shiroishi, Hinocho (JP); Koji Kawaguchi, Hinocho (JP); Yasushi Morikawa, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 287 days.

(21) Appl. No.: 18/102,455

(22) Filed: Jan. 27, 2023

(65) Prior Publication Data

US 2023/0278833 A1 Sep. 7, 2023

(30) Foreign Application Priority Data

Jan. 28, 2022 (JP) ................................. 2022-012244
Nov. 1, 2022 (JP) ................................. 2022-175348

(51) Int. Cl.
*B66C 13/08* (2006.01)
*B66C 11/00* (2006.01)
(Continued)

(52) U.S. Cl.
CPC .............. *B66C 13/08* (2013.01); *B66C 11/00* (2013.01); *B66C 19/00* (2013.01);
(Continued)

(58) Field of Classification Search
CPC ........... H01L 21/67733; H01L 21/6773; H01L 21/67259; H01L 21/68; H01L 21/6712;
(Continued)

(56) References Cited

U.S. PATENT DOCUMENTS 5,048,703 A * 9/1991 Tax ....................... B66C 13/063
 212/319
6,520,484 B1 * 2/2003 Shimizu ................... B66D 1/50
 254/276
(Continued)

FOREIGN PATENT DOCUMENTS

CN 112179316 A * 1/2021 ........... B65G 1/0457
JP S63258388 A * 10/1988
(Continued)

*Primary Examiner* — Anna M Momper
*Assistant Examiner* — Henrix Soto
(74) *Attorney, Agent, or Firm* — The Webb Law Firm

(57) ABSTRACT

An article transport vehicle includes a travel section, a holding section, an elevating device, an inclination detection device, an inclination adjustment device, and an inclination control device for controlling the inclination adjustment device. The inclination adjustment device is configured to act on a target belt among a plurality of suspension belts to adjust an inclination of the holding section by adjusting a suspension height at which the holding section is held by the target belt. During the lowering of the holding section to the transfer position by the elevating device, the inclination control device executes an adjustment operation during lowering, in which the inclination of the holding section is detected by the inclination detection device, and based on the result of the detection performed by the inclination detection device, the inclination adjustment device is controlled to adjust the inclination of the holding section.

12 Claims, 12 Drawing Sheets

(51) Int. Cl.
   *B66C 19/00* (2006.01)
   *H01L 21/677* (2006.01)
(52) U.S. Cl.
   CPC .. *H01L 21/67706* (2013.01); *H01L 21/67712* (2013.01); *H01L 21/67733* (2013.01)
(58) Field of Classification Search
   CPC ... H01L 21/67796; G01B 11/27; G01B 11/26; B65G 1/0457; B65G 1/04; B65G 2201/0297; B65G 2201/02; B66C 11/00; B66C 11/06; B66C 19/00; B66C 13/08; B66C 13/085; B66C 13/06; B66C 13/063
   USPC ........................................... 212/276
   See application file for complete search history.

(56) References Cited

U.S. PATENT DOCUMENTS

| | | | | |
|---|---|---|---|---|
| 2003/0015489 | A1* | 1/2003 | Uchida | B66C 13/46 212/326 |
| 2004/0195553 | A1* | 10/2004 | Hayashi | F21V 21/38 254/294 |
| 2011/0262004 | A1* | 10/2011 | Murakami | B66C 13/48 382/103 |
| 2015/0090684 | A1* | 4/2015 | Liao | B66C 19/00 212/276 |
| 2015/0291400 | A1* | 10/2015 | Rintanen | B66C 13/46 700/214 |
| 2016/0276191 | A1* | 9/2016 | Kinugawa | H01L 21/67259 |
| 2017/0152111 | A1* | 6/2017 | Kinugawa | H01L 21/67712 |
| 2018/0122656 | A1* | 5/2018 | Murakami | B66C 1/663 |
| 2020/0010307 | A1* | 1/2020 | Gunji | B66C 13/06 |
| 2020/0176294 | A1* | 6/2020 | Chen | H01L 21/67736 |
| 2022/0402731 | A1 | 12/2022 | Kobayashi | |
| 2024/0017973 | A1 | 1/2024 | Kobayashi | |

FOREIGN PATENT DOCUMENTS

| | | | | |
|---|---|---|---|---|
| JP | 2006213216 A | * | 8/2006 | |
| JP | 2019185499 A | | 10/2019 | |
| JP | 20207847 A | | 1/2020 | |
| JP | 7351423 B2 | | 9/2023 | |
| KR | 20200039226 A | * | 4/2020 | |
| WO | WO-2020121765 A1 | * | 6/2020 | ............ B61B 3/00 |
| WO | WO-2021100297 A1 | * | 5/2021 | ........... B65G 1/0457 |

\* cited by examiner

ARTICLE TRANSPORT VEHICLE

CROSS-REFERENCE TO RELATED APPLICATION

This application claims priority to Japanese Patent Application Nos. 2022-012244 filed Jan. 28, 2022 and 2022-175348 filed Nov. 1, 2022, the disclosures of which are hereby incorporated by reference in their entireties.

BACKGROUND OF THE INVENTION

1. Field of the Invention

The present invention relates to an article transport vehicle that includes a travel section that travels along a travel route, a holding section that holds an article, and an elevating device that lifts and lowers the holding section in a suspended state.

2. Description of the Related Art

An example of such an article transport vehicle is disclosed in Japanese Patent Application Laid-Open No. 2019-185499 (Patent Document 1).

The article transport vehicle disclosed in Patent Document 1 includes a travel section that travels along a travel route provided near the ceiling, a holding section that holds an article, and an elevating device that raises and lowers the holding section in a suspended state. In this elevating device, the holding section is suspended by a suspending member constituted by a wire, a belt, or the like, and by winding or unwinding the suspending member, the holding section is raised and lowered between a travel position for traveling along the travel route and a transfer position for transferring the article between a transfer target location and the holding section.

SUMMARY OF THE INVENTION

Incidentally, a belt (hereinafter referred to as a "suspension belt") is often used as the suspending member, but the thickness and elongation of the suspension belt varies due to manufacturing errors and the like. For this reason, the inclination of the holding section may change according to the winding and unwinding of the suspension belt. However, it has been difficult to appropriately adjust the orientation of the holding section in accordance with the change in inclination of the holding section between the traveling position and the transfer position.

In view of this, realization of an article transport vehicle that can appropriately adjust the orientation of the holding section even when the inclination of the holding segment changes according to the winding and unwinding of the suspension belt is desired.

In view of the above, a characteristic configuration of the article transport vehicle is an article transport vehicle configured to transport an article, the article transport vehicle including: a travel section configured to travel along a travel route; a holding section configured to hold the article; an elevating device configured to raise the holding section to a travel position for traveling along the travel route and lower the holding section to a transfer position for transferring the article between a transfer target location and the holding section, by winding and unwinding a plurality of suspension belts while the holding section is suspended by the plurality of suspension belts; an inclination detection device configured to detect inclination of the holding section with respect to a horizontal plane; an inclination adjustment device configured to adjust the inclination of the holding section; and an inclination control device configured to control the inclination adjustment device, in which the inclination adjustment device is configured to adjust the inclination of the holding section by acting on at least one target belt among the plurality of suspension belts to adjust a suspension height at which the holding section is suspended by the at least one target belt, and the inclination control device executes an adjustment operation during lowering, in which, during lowering of the holding section to the transfer position by the elevating device, the inclination of the holding section is detected by the inclination detection device, and based on the result of the detection performed by the inclination detection device, the inclination adjustment device is controlled to adjust the inclination of the holding section.

According to this configuration, since the inclination of the holding section is adjusted while the holding section is being lowered, even if the inclination of the holding section changes according to the winding and unwinding of the suspension belts, the orientation of the holding section can be appropriately adjusted. Also, even if there are a plurality of transfer target locations along the travel route and the height of the transfer position with respect to each transfer target location differs, the inclination of the holding section can be appropriately adjusted according to the height of the transfer position. Alternatively, even if the inclination of the holding section changes due to aging of the suspension belts or change in the usage environment, the orientation of the holding section can be appropriately adjusted according to the change. Furthermore, according to this configuration, since the inclination of the holding section is adjusted by the inclination adjustment device while the holding section is being lowered, the time required for the transfer operation of the article can be shortened.

Further features and advantages of the article transport vehicle will become apparent from the following description of the embodiments described with reference to the drawings.

DESCRIPTION OF THE INVENTION

An embodiment of an article transport vehicle 10 will be described by illustrating a case in which the article transport vehicle 10 is applied to an article transport facility 100.

Figure 1:
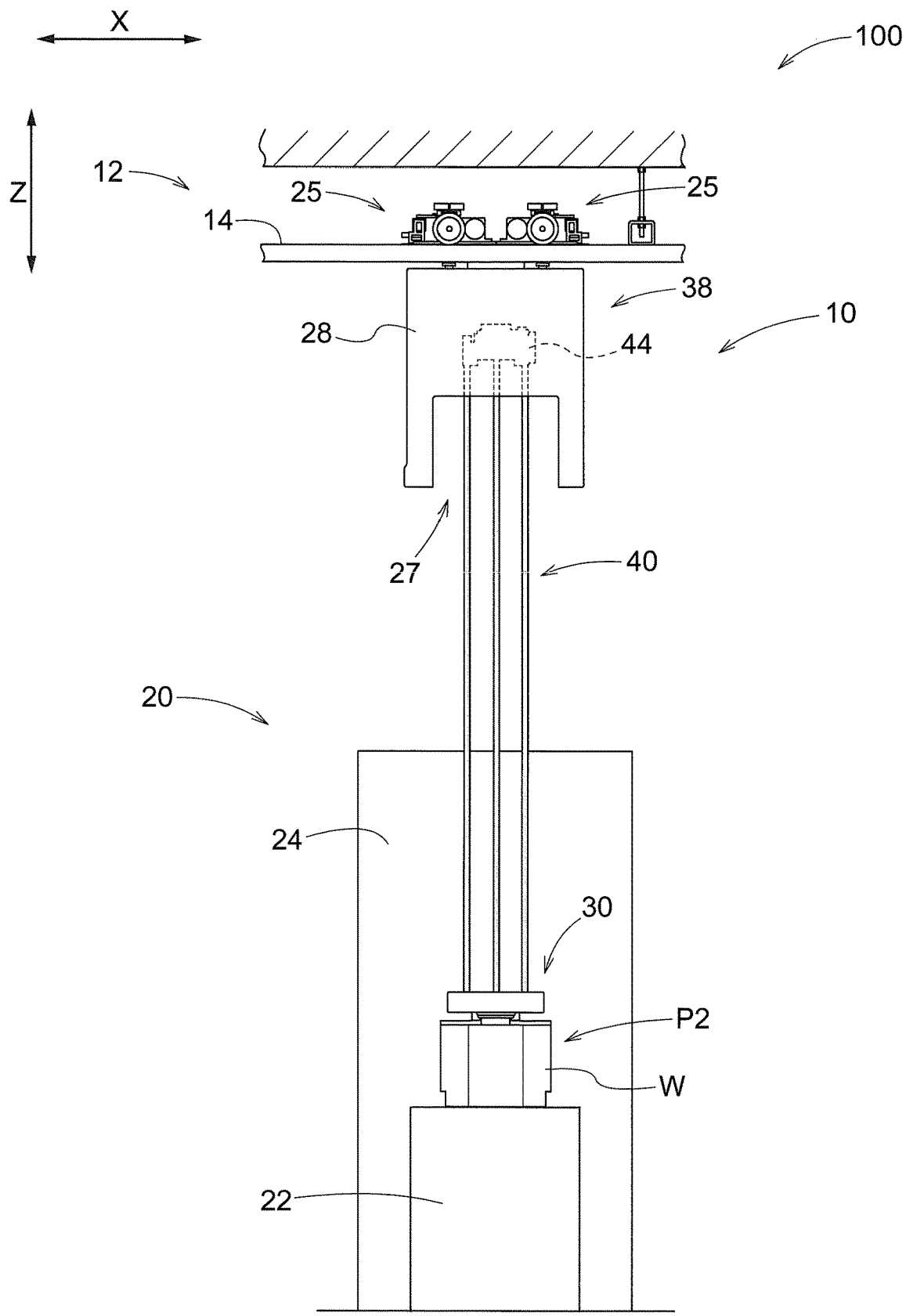
FIG. 1 is a front view showing an article transport facility of a first embodiment.

As shown in FIG. 1, the article transport facility 100 includes an article transport vehicle 10 for transporting an article W, a rail 14 forming a travel route 12 along which the article transport vehicle 10 travels in the upper part of the article transport facility 100, and a transfer target location 20 to which the article W is transferred to and from the article transport vehicle 10. Here, the longitudinal direction of the travel route 12 is a route longitudinal direction X, and the width direction of the travel route 12 is a width direction Y. The width direction Y is a direction orthogonal to both the path longitudinal direction X and a vertical direction Z, which is the vertical direction.

In this embodiment, a plurality of transfer target locations 20 are present along the travel route 12. A support platform 22 for supporting the article W is provided at the transfer target location 20. The support platform 22 is arranged adjacent to a processing device 24 that processes the article W. The article transport vehicle 10, for example, transports an article W that has yet to be processed by the processing device 24 from a transportation source (not shown) to the support platform 22, and transports the article W that has been processed by the processing device 24 from the support platform 22 to a transport destination (not shown).

In the present embodiment, the article W is a container that stores a processing target object to be processed by the processing device 24, and the above-mentioned "processing performed on the article" means processing performed on the processing target object stored in the article W. For example, the article W may be a wafer storage container for storing a wafer (a so-called FOUP: Front Opening Unified Pod) or a reticle storage container for storing a reticle (a so-called reticle pod). If the article W is a FOUP, the processing target object is a wafer. If the article W is a reticle pod, the processing target object is a reticle. The transfer target location 20 is a location to which the article transport vehicle 10 and the article W are transferred, and for example, may be the transfer source of the article W or the transfer destination of the article W. Also, the transfer target location 20 may be a support platform 22 arranged adjacent to a stocker that stores the article W, a buffer that temporarily holds the article W, or the like. Also, if there are a plurality of transfer target locations 20, the heights of the support platforms 22 may be different from each other.

The article transport vehicle 10 includes a travel section 25 that travels along the travel route 12, a holding section 30 that holds the article W, and an elevating device 38. While the holding section 30 is suspended by a plurality of suspension belts 40, the elevating device 38 performs raising of the holding section 30 to a travel position P1 for traveling along the travel route 12 and lowering of the holding section 30 to a transfer position P2 for transferring the article W between the transfer target location 20 and the holding section 30, by winding and unwinding the plurality of suspension belts 40.

Figure 2:
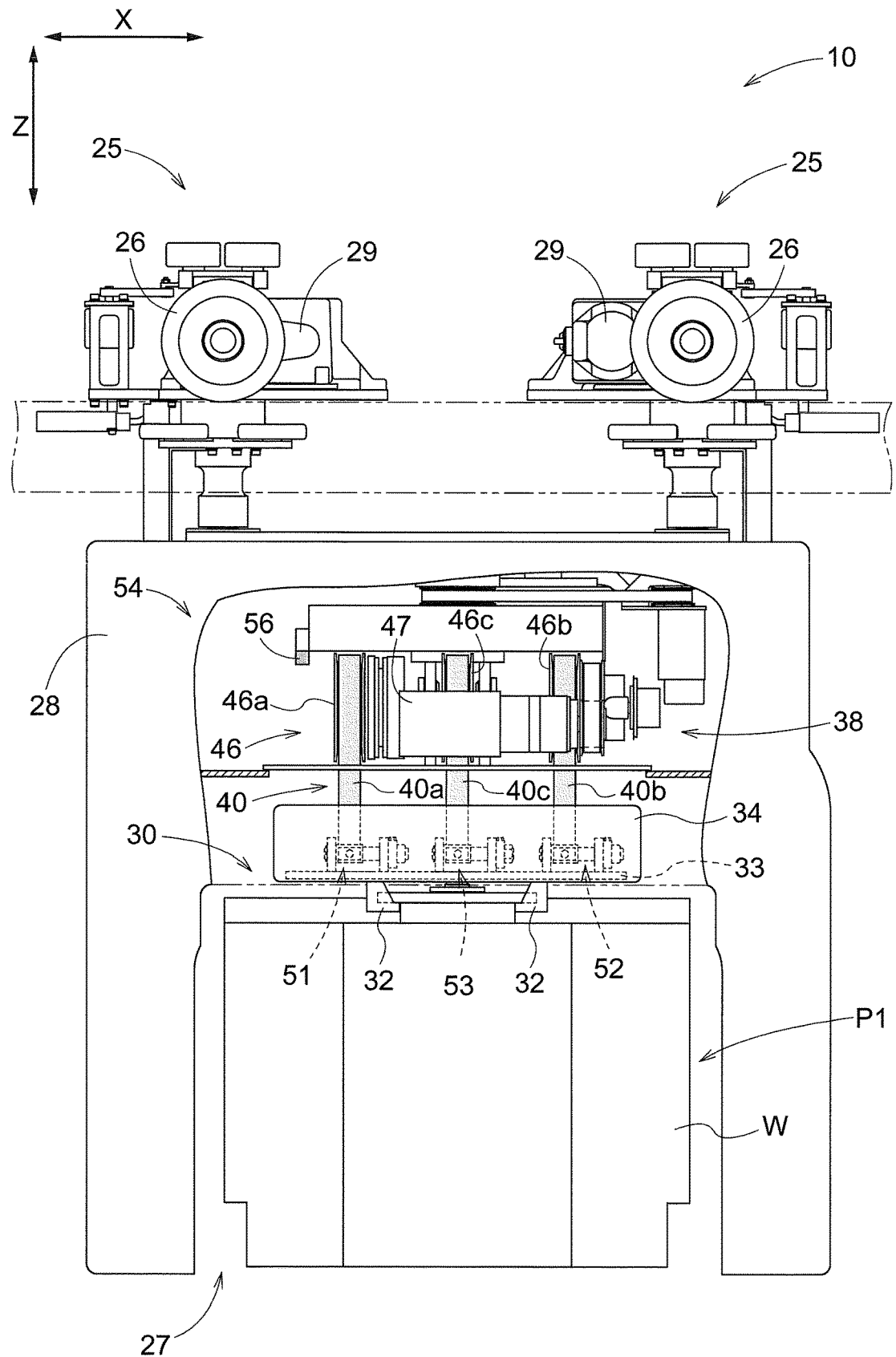
FIG. 2 is a front view of an article transport vehicle of the first embodiment.

The elevating device 38 is connected to the travel section 25. Also, the elevating device 38 includes an elevating motor 44 that drives three suspension belts 40 to raise and lower the holding section 30 in the vertical direction Z between the travel position P1 and the transfer position P2. The holding section 30 shown in FIG. 2 is located at the travel position P1. The holding section 30 shown in FIG. 1 is located at the transfer position P2. The article transport vehicle 10 includes a storage section 27 that stores the holding segment 30 when the holding section 30 is located at the travel position P1, and a cover 28 that covers the storage section 27. The holding section 30 is arranged at a height corresponding to the support platform 22 of the transfer target location 20 while at the transfer position P2.

The cover 28 is suspended and supported by the travel section 25. The cover 28 covers the upper side of the storage section 27 and both sides in the traveling direction of the travel section 25. In the illustrated example, the travel section 25 is arranged above the rail 14 and the cover 28 is arranged below the rail 14. As shown in FIG. 2, the travel section 25 includes travel wheels 26 that roll on the rail 14 and a travel motor 29 that drives the travel wheels 26. In the illustrated example, the article transport vehicle 10 is provided with a plurality of travel sections 25. The travel motor 29 drives the travel wheels 26 provided in the travel sections 25 to provide a driving force by which the article transport vehicle 10 travels.

The holding section 30 includes a pair of gripping claws 32 and a gripping motor (not shown) that moves the pair of gripping claws 32 toward and away from each other. The holding section 30 switches between a gripping state in which the pair of gripping claws 32 grip a flange section of the article W and a release state in which the gripping state is released, by moving the pair of gripping claws 32 toward or away from each other by driving the gripping motor. Also, the holding section 30 includes a base section 33 and a casing 34 that covers the upper section of the base section 33. The pair of gripping claws 32 are arranged so as to protrude below the base section 33. Note that in FIGS. 2 and 3, the structure and various devices such as a gripping motor for moving the pair of gripping claws 32 toward and away from each other are omitted.

The elevating device 38 includes a plurality of winding pulleys 46 around which the plurality of suspension belts 40 are respectively wound, and a winding driving section 47 that drives the plurality of winding pulleys 46 to rotate. The elevating device 38 lowers the holding part 30 by unwinding the suspension belts 40 from the respective winding pulleys 46, and raises the holding section 30 by winding the suspension belts 40 around the respective winding pulleys 46. In this embodiment, the elevating device 38 includes a plurality of suspension belts 40. The upper section of the suspension belt 40 is wound around a winding pulley 46 and the lower section thereof is fixed to the holding section 30. For example, the elevating device 38 rotates the winding pulley 46 in a normal rotation direction by driving the winding driving section 47, and winds the suspension belt 40, thereby raising the holding section 30. Also, the elevating device 38 rotates the winding pulley 46 in the reverse rotation direction by driving the winding driving section 47, for example, and unwinds the suspension belt 40, thereby lowering the holding section 30. Due to the elevating device 38 raising and lowering the holding section 30, the article W can be transferred between the holding section 30 and the support platform 22 arranged below the storage section 27.

In this embodiment, the elevating device 38 includes three winding pulleys 46, and three suspension belts 40, namely, a first belt 40a, a second belt 40b, and a third belt 40c, and the three winding pulleys 46 are driven by the one rotation driving section 47. In the winding driving section 47, for example, an elevating motor or the like is used. In the illustrated example, the winding pulleys 46 include a first winding pulley 46a, a second winding pulley 46b, and a third winding pulley 46c.

Figure 3:
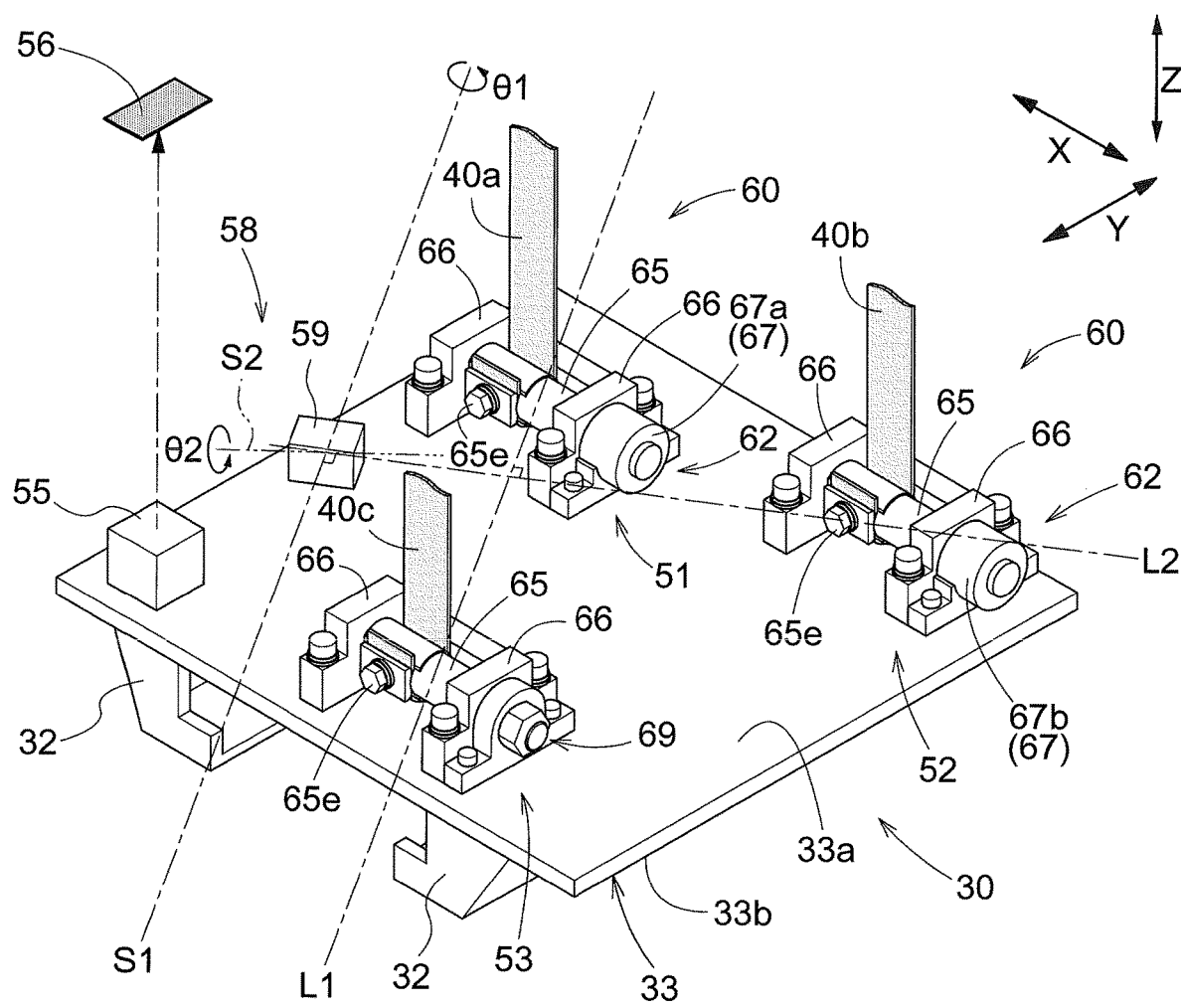
FIG. 3 is a perspective view showing a holding section of the article transport vehicle of the first embodiment.

In this embodiment, the article transport vehicle 10 includes a suspension height detection device 54 that detects the suspension height H (m) of the holding section 30. As shown in FIGS. 2 and 3, the suspension height detection device 54 includes a height detection sensor 55 and a height detection reflective plate 56. In this embodiment, the height detection sensor 55 functions as an elevation detection device that detects whether or not the holding section 30 is being lowered to the transfer position P2. In the illustrated example, the height detection sensor 55 is mounted on the holding section 30. As such a height detection sensor 55, for example, a laser range finder or the like can be used. Note that the suspension height detection device 54 is not limited to this, and for example, may detect the suspension height H(m) of the holding section 30 through image recognition. Also, the elevation detection device is not limited to this, and for example, may detect whether or not the holding section 30 is being lowered to the transfer position P2 through image recognition. Here, "mounted on the holding section 30" means that the target object mounted on the holding section 30 is provided on the holding section 30 so as to rise and lower together with at least the holding section 30.

In this embodiment, the height detection reflective plate 56 is attached to the travel section 25 or a portion of the elevating device 38 on the travel section 25 side, which is a portion that does not rise and lower together with the holding section 30. The height detection sensor 55 is a reflective optical sensor that is attached to the upper surface 33a of the base section 33, which is a portion that rises and lowers together with the holding section 30, and the height detection sensor 55 detects the height detection reflective plate 56. The upper surface 33a of the base section 33 functions as a reference surface of the holding section 30. Note that the height detection reflective plate 56 may be attached to the upper surface 33a of the base section 33, and the height detection sensor 55 may be attached to the travel section 25.

The article transport vehicle 10 includes an inclination adjustment device 60 that adjusts an inclination Ti (rad) of the holding section 30. In this embodiment, the inclination adjustment device 60 is mounted on the holding section 30. The inclination adjustment device 60 adjusts the inclination Ti of the holding section 30 by acting on a target belt, which is at least one of the plurality of suspension belts 40, to adjust the suspension height H at which the holding section 30 is suspended by the target belt. In this embodiment, the plurality of suspension belts 40 includes a first belt 40a, a second belt 40b, and a third belt 40c that are connected to mutually different portions of the holding section 30. The first belt 40a, the second belt 40b, and the third belt 40c share the suspension load of the holding section 30. Also, the first belt 40a and the second belt 40b are the target belts described above. The inclination adjustment device 60 adjusts the suspension height H of the target belts. That is, the inclination adjustment device 60 adjusts the position in the vertical direction Z of the portion of the holding section 30 connected to the target belts, which are the first belt 40a and the second belt 40b. The first belt 40a and the holding section 30 are connected to each other by a first connection section 51. The second belt 40b and the holding section 30 are connected to each other by a second connection section 52. The third belt 40c and the holding section 30 are connected to each other by a third connection section 53. In the illustrated example, the inclination adjustment device 60 adjusts the positions of the first connection section 51 and the second connection section 52 in the vertical direction Z.

The first connection section 51, the second connection section 52, and the third connection section 53 each include a belt winding shaft 65 and a belt support section 66 that supports the belt winding shaft 65 so as to be relatively rotatable. The belt support section 66 is fixed to the base section 33 of the holding section 30. The lower section of the suspension belt 40 is wound around the belt winding shaft 65 and fastened with a belt fixing bolt 65e. An adjustment winding motor 67 is connected to an end of the belt winding shaft 65 connected to the target belt, which is a part of the suspension belts 40. In the illustrated example, a first adjustment winding motor 67a is connected to the end of the belt winding shaft 65 connected to the first belt 40a. A second adjustment winding motor 67b is connected to the end of the belt winding shaft 65 connected to the second belt 40b. A fixing mechanism 69 that prevents the belt winding shaft 65 and the belt support section 66 from rotating relative to each other is connected to the end of the belt winding shaft 65 that is connected to the suspension belt 40 that is not the target belt. In the illustrated example, the fixing mechanism 69 is connected to the end of the belt winding shaft 65 connected to the third belt 40c. A double nut or the like is used for the fixing mechanism 69, for example.

The article transport vehicle 10 includes an inclination adjustment device 60 that adjusts the inclination Ti of the holding section 30. In this embodiment, the inclination adjustment device 60 includes an adjustment winding device 62 that is provided separately from the winding pulley 46 and can wind and unwind the target belt. In the illustrated example, the belt winding shafts 65 connected to the first belt 40a and the second belt 40b, which are the target belts, the belt fixing bolt 65e, and the adjustment winding motor 67 function as the adjustment winding device 62 of the inclination adjustment device 60. When the first adjustment winding motor 67a is rotated, for example, in the normal rotation direction, the first belt 40a is wound and the first connection section 51 rises. When the first adjustment winding motor 67a is rotated, for example, in the reverse direction, the first belt 40a is unwound and the first connection section 51 is lowered. Similarly, when the second adjustment winding motor 67b is rotated, for example, in the normal rotation direction, the second belt 40b is wound and the second connection section 52 rises. Also, when the second adjustment winding motor 67b is rotated, for example, in the reverse direction, the first belt 40a is unwound and the first connection section 51 is lowered. By these operations, the inclination adjustment device 60 can adjust the inclination Ti of the holding section 30. In the present embodiment, since the inclination adjustment device 60 is provided in the holding section 30, maintenance and inspection work of the inclination adjustment device 60 can be performed without stopping the article conveying facility 100 by replacing the holding section 30.

The article transport vehicle 10 includes an inclination detection device 58 that detects the inclination Ti of the holding section 30 with respect to the horizontal plane. In this embodiment, the inclination detection device 58 includes an inclination sensor 59 attached to the holding section 30. The inclination sensor 59 is configured to detect an inclination angle θ1 (rad) about a first detection axis S1 and an inclination angle θ2 (rad) about a second detection axis S2 orthogonal to the first detection axis S1. A virtual line connecting the first connection section 51 and the third connection section 53 is a first virtual line L1, and a virtual line that passes through the second connection section 52 and is perpendicular to the first virtual line L1 is a second virtual line L2. In this embodiment, the inclination sensor 59 is arranged such that either the first detection axis S1 or the second detection axis S2 overlaps with the second virtual line L2 in a view in the vertical direction. In the example of FIG. 3, the second detection axis S2 of the inclination sensor 59 overlaps with the second virtual line L2 when viewed in the vertical direction. Also, the first detection axis S1 of the inclination sensor 59 is parallel to the first virtual line L1 when viewed in the vertical direction.

The first connection section 51, the second connection section 52, and the third connection section 53 are attached to the upper surface 33a of the base section 33, which is a reference surface. In the illustrated example, the inclination sensor 59 is arranged on the second virtual line L2. Preferably, the inclination sensor 59 is attached to the upper surface 33a of the base section 33, which is the reference surface, and detects an inclination angle θ1 about the first detection axis S1 and an inclination angle θ2 about the second detection axis S2 as the inclination Ti of the upper surface 33a. Note that the inclination Ti of the holding section 30 with respect to the horizontal plane detected by the inclination detection device 58 is the inclination of the holding section 30 in the space in which the holding section 30 is present, and there is no particular limitation on the detection method thereof. Accordingly, if the inclination sensor 59 detects the inclination Ti as in this example, the reference surface of the inclination sensor 59 does not need to be horizontal, and the reference surface of the inclination sensor 59 may be inclined with respect to the horizontal plane.

Figure 4:
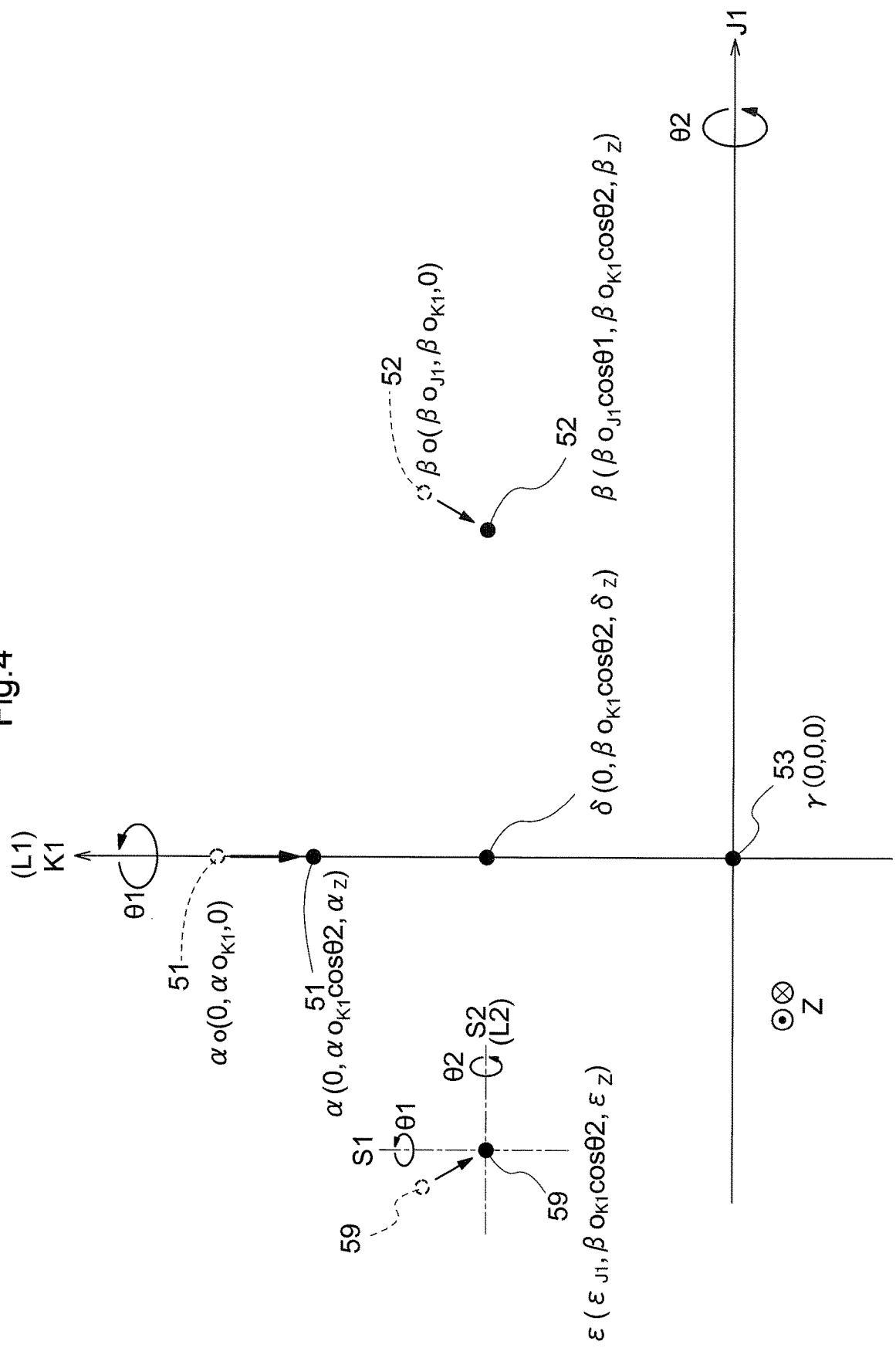
FIG. 4 is a diagram showing an arrangement of an inclination sensor, a first connection section, a second connection section, and a third connection section of the first embodiment.

FIG. 4 is a diagram in which the arrangement of the inclination sensor 59, the first connection section 51, the second connection section 52, and the third connection section 53 are viewed from above in the vertical direction Z when the vertical axis is a horizontal virtual axis K1, the horizontal axis is a horizontal virtual axis J1 orthogonal to the virtual axis K1, and the vertical direction Z is an axis orthogonal to the paper surface. The virtual axis K1 is a straight line that overlaps with the first virtual line L1 and passes through the third connection section 53 when viewed in the vertical direction. For this reason, the virtual axis K1 is a straight line parallel to the first detection axis S1 when viewed in the vertical direction, similarly to the first virtual line L1. Also, the virtual axis J1 is a straight line that is parallel to the second virtual line L2 and passes through the third connection section 53. For this reason, the virtual axis J1 is a straight line parallel to the second detection axis S2 when viewed in the vertical direction, similarly to the second virtual line L2. As shown in FIG. 4, the inclination angle about the virtual axis K1 parallel to the first detection axis S1 has the same value as the inclination angle θ1, and the inclination angle about the virtual axis J1 parallel to the second detection axis S2 has the same value as the inclination angle θ2.

In the example of FIG. 4, the inclination angle θ1 about the first detection axis S1 and the inclination angle θ2 about the second detection axis S2 are each set to 0 (rad) when the reference plane, which is the upper surface 33a of the base section 33, is horizontal. Also, a coordinate y of the third connection section 53 is set as the origin. Coordinates ε ($\varepsilon_{J1}$, $\beta o_{K1} \cos \theta 2$, $\varepsilon_Z$) are the coordinates of the inclination sensor 59 when the upper surface 33a is inclined. Also, coordinates δ (0, $\beta o_{K1} \cos \theta 2$, $\delta_Z$) are the coordinates of an intersegment point between a straight line connecting the inclination sensor 59 and the second connection section 52, and a straight line connecting the first connection section 51 and the third connection section 53 when the upper surface 33a is inclined.

The coordinates of the first connection section 51 when the upper surface 33a, which is the reference surface, is horizontal, are the coordinates αo (0, $\alpha o_{K1}$, 0), and the coordinates of the second connection section 52 when the upper surface 33a is horizontal are the coordinates βo ($\beta o_{J1}$, $\beta o_{K1}$, 0). In this manner, the coordinate $\alpha_Z$, which is the Z coordinate of the first connection section 61 when the upper surface 33a is inclined, is expressed by the following formula (1). The coordinate $\beta_Z$, which is the Z coordinate of the second connection section 52 when the upper surface 33a is inclined, is expressed by the following formula (2).

$$\alpha_Z = \alpha o_{K1} \sin \theta 2 \tag{1}$$

$$\beta_Z = \beta o_{K1} \sin \theta 2 + \beta o_{J1} \sin \theta 1 \tag{2}$$

The magnitude of the above-described coordinate $\alpha_Z$ is used, for example, as an adjustment amount Bi1 of the first belt 40a for making the inclination Ti of the holding section 30 horizontal. Also, the magnitude of the coordinate $\beta_Z$ is used, for example, as an adjustment amount Bi2 of the second belt 40b for making the inclination Ti of the holding section 30 horizontal. In this manner, if the inclination sensor 59 is arranged such that either the first detection axis S1 or the second detection axis S2 overlaps with the second virtual line L2 when viewed in the vertical direction, when the inclination sensor 59 that detects the inclination angles of the two axes is used, it is possible to simplify the arithmetic processing for obtaining the adjustment amount Bi1 of the first belt 40a and the adjustment amount Bi2 of the second belt 40b.

Figure 5:
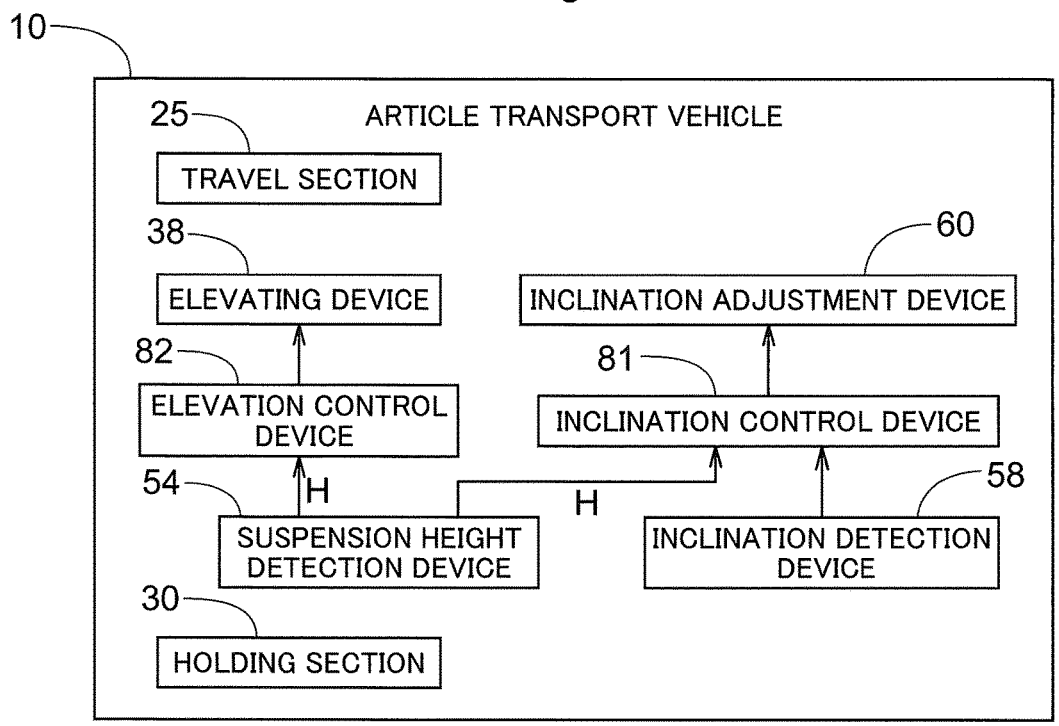
FIG. 5 is a control block diagram of the first embodiment.

FIG. 5 is an example of a control block diagram of this embodiment. The article transport vehicle 10 has an inclination control device 81 that controls the inclination adjustment device 60. In this embodiment, the inclination control device 81 is mounted on the holding section 30.

The inclination control device 81 executes an adjustment operation during lowering, in which the inclination Ti of the holding section 30 is detected by the inclination detection device 58 while the holding section 30 is being lowered to the transfer position P2 by the elevating device 38, and the inclination adjustment device 60 is controlled based on the result of the determination performed by the inclination determination device 58 to adjust the inclination Ti of the holding section 30. In this embodiment, the inclination Ti is detected by the inclination detection device 58 while the holding section 30 is being lowered for transfer. The inclination Ti may be detected while the holding section 30 is lowered to transfer the article W from the transfer target location 20 to the holding section 30, and the inclination Ti may be detected while the holding section 30 is lowered to transfer the article W held by the holding section 30 to the transfer target location 20. Preferably, it is desirable to detect the inclination Ti during lowering when the holding section 30 is not holding the article W, such as during lowering of the holding section 30 for transferring the article W from the transfer target location 20 to the holding section 30.

The inclination control device 81 adjusts the inclination Ti while the holding section 30 is being lowered, and therefore the orientation of the holding section 30 can be appropriately adjusted even if the inclination Ti of the holding section 30 changes according to the winding or unwinding of the suspension belt 40. Also, even if there are a plurality of transfer target locations 20 along the travel route 12 and the heights of the transfer positions P2 with respect to each of the transfer target locations 20 are different, the inclination Ti of the holding section 30 can be appropriately adjusted according to the height of each transfer position P2. Even if the inclination Ti of the holding section 30 changes due to aging of the suspension belt 40 or change in the usage environment, the orientation of the holding section 30 can be appropriately adjusted in response to the change. Also, since the inclination control device 81 adjusts the inclination Ti of the holding section 30 by the inclination adjustment device 60 while the holding unit 30 is being lowered, the time required for the transfer operation of the article W can be shortened. Also, in some cases, a jig having a sensor or the like is held by the holding section 30, and the position and the like of the transfer target location 20 are measured by the jig and learned. When learning using such a jig, measurement with use of the jig is performed when the pair of gripping claws 32 of the holding section 30 have been adjusted by the inclination adjustment device 60 so that they are aligned horizontally, eliminating the need to correct the inclination that can be adjusted by the inclination adjustment device 60 with respect to the measurement result of the jig.

The inclination control device 81 calculates the lowering speed Vd (m/s) and the raising speed Vu (m/s) of the holding section 30 based on the change over time in the suspension height H detected by the suspension height detection device 54, for example. Here, the maximum speed of the holding section 30 during lowering to the transfer position P2 is a maximum lowering speed V1. In this embodiment, the inclination control device 81 causes the suspension height detection device 54 to detect the suspension height H at least in the segment from the lowering start time t0 to the lowering end time te, and calculates the lowering speed Vd of the holding section 30 at any time.

The inclination control device 81 causes the inclination detection device 58 to detect the inclination Ti of the holding section 30 a plurality of times in the measurement segment Dt in which the holding section 30 is lowered at a speed Vt for measurement, which is a constant speed lower than the maximum lowering speed V1 in the adjustment operation during lowering, and the inclination control device 81 adjusts the inclination Ti of the holding section 30 based on the plurality of detection results. In this embodiment, the inclination control device 81 calculates, for example, an average value or a median value based on the inclination Ti detected a plurality of times in the measurement segment Dt. Also, the inclination control device 81 adjusts the inclination Ti of the holding section 30 after the measurement segment Dt.

The article transport vehicle 10 includes an elevation control device 82 that controls the elevating device 38. If the elevation control device 82 includes a plurality of pieces of hardware separated from each other in such a manner as to be able to communicate with each other, some of the hardware may be provided in the article transport vehicle 10, and the remaining hardware may be provided in an external control device (not shown) that is independent of the article transport vehicle 10.

The elevation control device 82 executes stepwise deceleration control in which the lowering speed Vd of the holding section 30 is reduced during lowering to the transfer position P2 from the maximum lowering speed V1 to an intermediate speed V2 in the first deceleration segment D4 after the maximum speed segment D3 in which the holding section 30 is lowered at the maximum lowering speed V1, then the intermediate speed V2 is maintained in the intermediate segment D5, then the lowering speed Vd is reduced from the intermediate speed V2 to a pre-stop speed V3 in the second deceleration segment D6, then the pre-stop speed V3 is maintained in a pre-stop segment D7, and the holding section 30 is stopped at the suspension height H corresponding to the transfer position P2. Here, the measurement segment Dt is within the intermediate segment D5.

Figure 6:
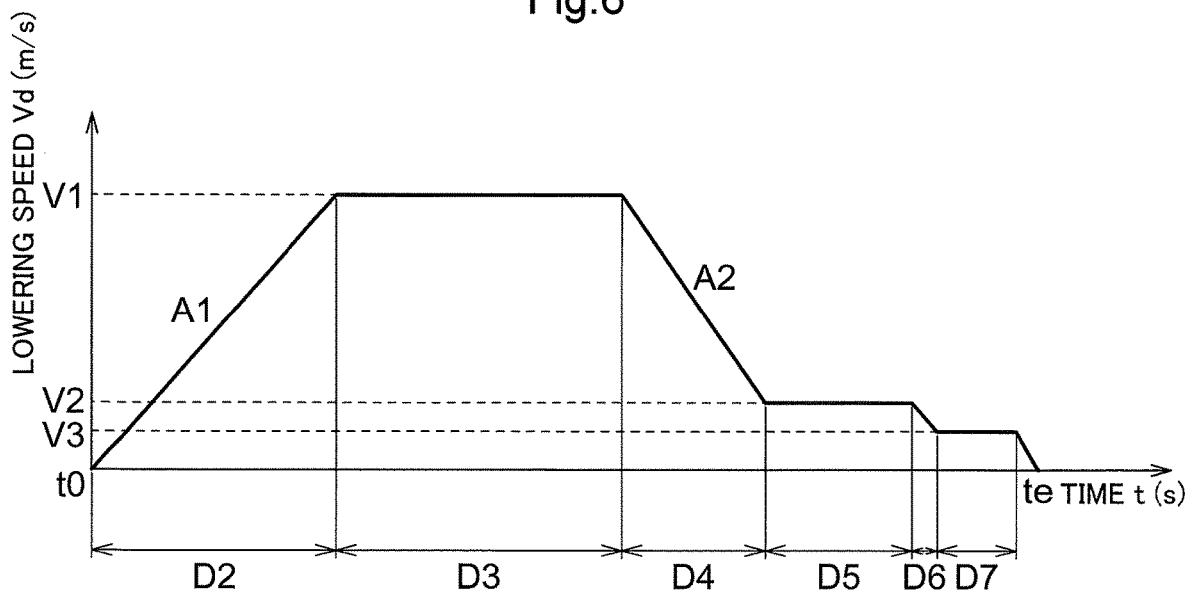
FIG. 6 is a diagram showing a time chart of a lowering operation of the first embodiment.

FIG. 6 is an example of a time chart of the lowering operation performed by the elevation control device 82, where the vertical axis is the lowering speed Vd (m/s) and the horizontal axis is the time t (s).

The elevation control device 82 controls the elevating device 38 such that the holding section 30 is lowered at a lowering start speed V4, which is, for example, a creep speed, in an initial movement segment D1 (not shown) immediately after the holding section 30 starts to be lowered from the travel position P1. Next, the elevation control device 82 controls the elevating device 38 such that the holding section 30 is lowered while being accelerated at a predetermined lowering acceleration A1 (m/s$^2$) in the acceleration segment D2. When the lowering speed Vd of the holding section 30 reaches the maximum lowering speed V1, the elevation control device 82 maintains the maximum lowering speed V1 in the maximum speed segment D3 and controls the elevating device 38 such that the holding section 30 is lowered at a constant speed. When the holding section 30 is lowered and enters the first deceleration segment D4, the elevation control device 82 controls the elevating device 38 such that the holding section 30 is lowered while decelerating at a predetermined lowering deceleration A2 (m/s$^2$).

When the lowering speed Vd of the holding section 30 is reduced to the intermediate speed V2, the elevation control device 82 controls the elevating device 38 such that the lowering speed Vd is maintained at the intermediate speed V2 in the intermediate segment D5 and the holding section 30 is lowered at a constant speed. When the intermediate segment D5 ends, the elevation control device 82 controls the elevating device 38 in the second deceleration segment D6 such that the holding section 30 decelerates from the intermediate speed V2 to the pre-stop speed V3, which is, for example, the creep speed. When the lowering speed Vd of the holding section 30 is reduced to the pre-stop speed V3, the elevation control device 82 maintains the pre-stop speed V3 in the pre-stop segment D7, and controls the elevating device 38 such that the holding section 30 is lowered at a constant speed. This pre-stop speed V3 may be the same as the lowering start speed V4. When the holding section 30 reaches the suspension height H corresponding to the transfer position P2, the holding section 30 is stopped.

Figure 7:
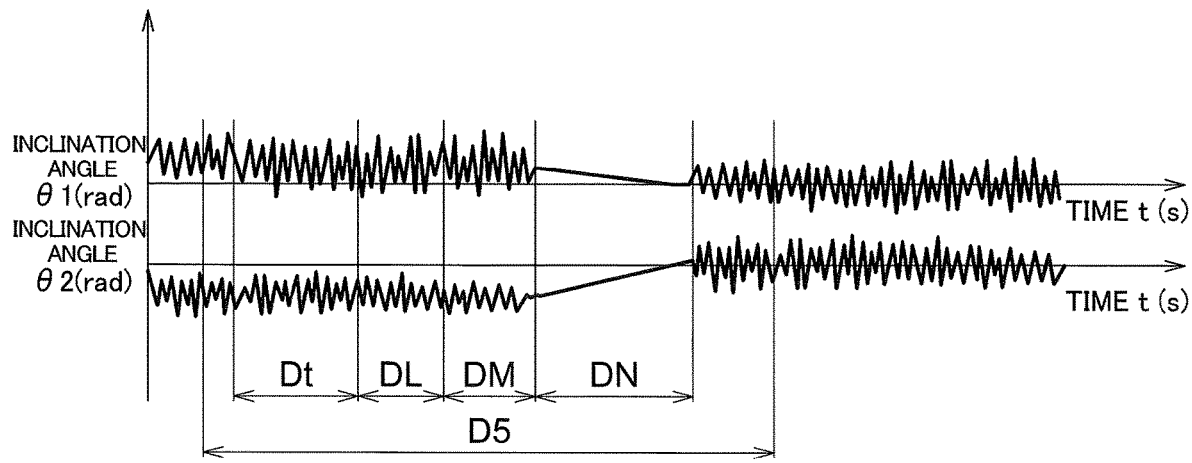
FIG. 7 is a diagram showing a time chart of a lowering operation, showing an enlarged intermediate segment of the first embodiment.

FIG. 7 is an example of a time chart of the lowering operation, showing the intermediate segment D5 enlarged. In the present embodiment, the inclination control device 81 causes the inclination detection device 58 to detect the inclination Ti of the holding section 30 a plurality of times in the measurement segment Dt in which the holding section 30 is lowered at the constant measurement speed Vt, which is lower than the maximum lowering speed V1. The measurement segment Dt is within the intermediate segment D5.

Figure 8:
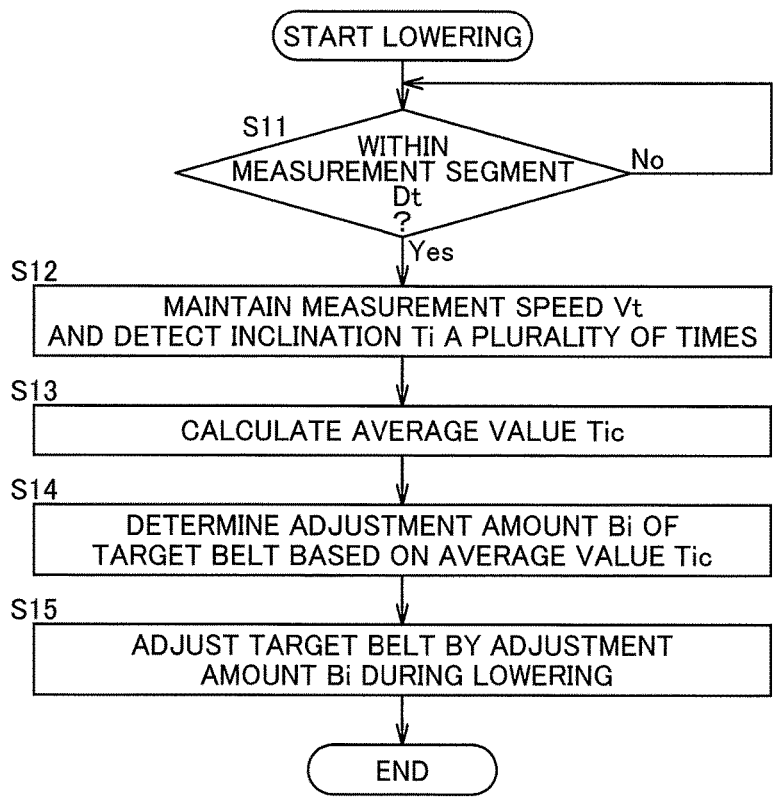
FIG. 8 is a diagram showing a flowchart of an adjustment operation during lowering of the first embodiment.

FIG. 8 is an example of a flowchart of the adjustment operation during lowering, which is performed by the inclination control device 81. In the present embodiment, the inclination control device 81 performs measurement segment determination processing S11 for determining whether or not the holding section 30 is within the measurement segment Dt. For example, the inclination control device 81 determines that the holding section 30 is within the measurement segment Dt when the lowering speed Vd of the holding section 30 is reduced from the maximum lowering speed V1 to the intermediate speed V2. If it is denied that the holding section 30 is within the measurement segment Dt, the inclination control device 81 repeats the measurement segment determination processing S11 at predetermined time intervals. If it is affirmed that the holding section 30 is within the measurement segment Dt, the inclination control device 81 performs inclination detection processing S12, and the inclination sensor 59 of the inclination detection device 58 detects the inclination Ti a plurality of times. In the example of FIG. 7, the inclination angle θ1 and the inclination angle θ2, which are the inclination Ti, are detected a plurality of times in the measurement segment Dt within the intermediate segment D5. Note that the inclination control device 81 may detect the inclination Ti at any time with use of the inclination detection device 58 not only in the measurement segment Dt, but in all segments.

Next, the inclination control device 81 performs average value calculation processing 513, and calculates an average value Tic of the inclination based on the inclination Ti of the holding section 30 detected a plurality of times. In the example of FIG. 7, the average inclination angle θ1c is calculated in the inclination calculation segment DL based on the inclination angle θ1 detected a plurality of times in the measurement segment Dt. Also, based on the inclination angle θ2 detected a plurality of times in the measurement segment Dt, an average inclination angle θ2c is calculated in the inclination calculation segment DL.

After calculating the average value Tic, the inclination control device 81 performs belt adjustment amount determination processing S14 to determine the adjustment amount Bi of the target belt based on the average value Tic. In the example of FIG. 7, the adjustment amount Bi1 of the first belt 40a and the adjustment amount Bi2 of the second belt 40b are calculated based on the average inclination angle θ1c and the average inclination angle θ2c in the adjustment amount calculation segment DM.

When the adjustment amount Bi of the target belt is calculated, the inclination control device 81 performs belt adjustment processing S15, and the inclination adjustment device 60 performs an adjustment operation during lowering, in which the suspension height H of the holding section 30 is adjusted by the target belt by the adjustment amount Bi. In the present embodiment, by rotating the first adjustment winding motor 67a, the first belt 40a is wound or unwound by the adjustment amount Bi1 of the first belt 40a, and by rotating the second adjustment winding motor 67b, the second belt 40b is wound or unwound by the adjustment amount Bi2 of the second belt 40b. In FIG. 7, the first belt 40a is adjusted by the adjustment amount Bi1 in the adjustment segment DN, and the second belt 40b is adjusted by the adjustment amount Bi2. Here, if the adjustment of the target belt is not completed in the intermediate segment D5 due to reasons such as the adjustment amount Bi being large, the target belt is adjusted in the pre-stop segment D7 in FIG. 6, which is a constant-speed lowering segment, similarly to the intermediate segment D5. Note that in this case, the target belt may be adjusted also in the segment between the intermediate segment D5 and the pre-stop segment D7, for example, the second deceleration segment D6. Also, the intermediate segment D5 may be the pre-stop segment D7. In other words, the intermediate speed V2 may be the same speed as the pre-stop speed V3. When the adjustment operation during lowering is completed, the inclination control device 81 ends the control processing.

Figure 9:
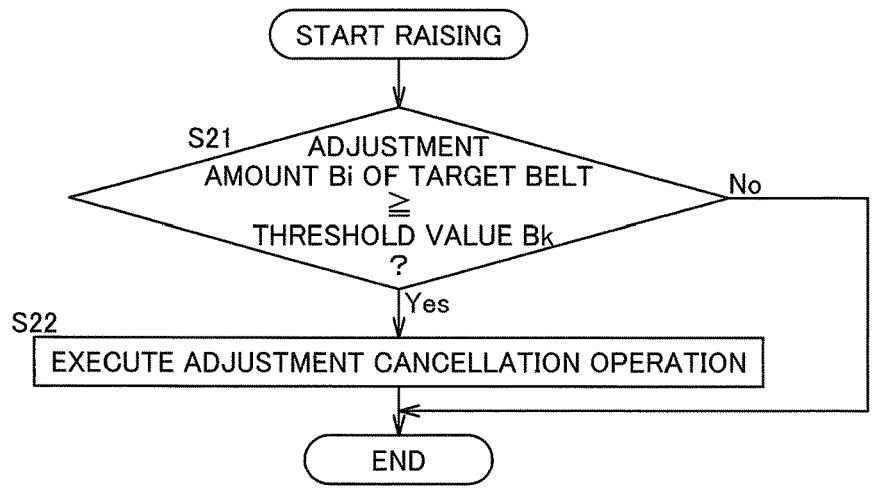
FIG. 9 is a diagram showing a flowchart of an adjustment cancellation operation of the first embodiment.

At a time that is during the raising of the holding section 30 to the travel position P1 or after completion of raising of the holding section 30 and is before travel by the travel section 25 is started, the inclination control device 81 executes an adjustment cancellation operation for undoing the adjustment amount Bi of the target belt in the adjustment operation during lowering, which is performed by the inclination adjustment device 60. FIG. 9 is a flow chart of the adjustment cancellation operation. The inclination control device 81 performs belt adjustment amount determination processing S21 for determining whether or not the adjustment amount Bi determined in the belt adjustment amount determination processing S14 after the holding section 30 starts to rise from the transfer position P2 is greater than or equal to a threshold value Bk.

If the belt adjustment amount determination processing S21 is affirmative, that is, if the adjustment amount Bi is equal to or greater than the threshold value Bk, the inclination control device 81 executes the adjustment amount cancellation processing S22. In the present embodiment, if the adjustment amount Bi1 of the first belt 40a is greater than or equal to the predetermined threshold value Bk1, if the adjustment amount Bi2 of the second belt 40b is greater than or equal to the predetermined threshold value Bk2, or if the adjustment amount Bi1 of the first belt 40a is greater than or equal to the threshold value Bk1 and the adjustment amount Bi2 of the second belt 40b is greater than or equal to the threshold value Bk2, the inclination control device 81 executes adjustment amount cancellation processing S22. In the adjustment amount cancellation processing S22, an adjustment cancellation operation for undoing the adjustment amount Bi of the target belt in the adjustment operation during lowering, which is performed by the inclination adjustment device 60, is performed. In this embodiment, the inclination control device 81 rotates the first adjustment winding motor 67b and the second adjustment winding motor 67a in such a manner as to eliminate both the adjustment amount Bi1 of the first belt 40a and the adjustment amount Bi2 of the second belt 40b. As a result, the inclination Ti is returned to the inclination Ti before performing the adjustment operation during lowering. Note that in the adjustment amount cancellation processing S22, out of the adjustment amount Bi1 of the first belt 40a and the adjustment amount Bi2 of the second belt 40b, only the adjustment amounts Bi1 and Bi2 of the target belts that exceed the respective threshold values Bk1 and Bk2 may be cancelled. When the adjustment cancellation operation is completed, the inclination control device 81 ends the control processing.

If the belt adjustment amount determination processing S21 is negative, that is, if the adjustment amount Bi is less than the threshold value Bk, the inclination control device 81 ends the control processing without performing the adjustment cancellation operation. In the present embodiment, the inclination control device 81 ends the control processing without performing the inclination cancellation operation if the adjustment amount Bi1 of the first belt 40a is less than the predetermined threshold value Bk1 and the adjustment amount Bi2 of the second belt 40b is less than the predetermined threshold value Bk2. Note that here, as an example, a configuration was described in which the inclination control device 81 executes the adjustment cancellation operation if the adjustment amount Bi is greater than or equal to the prescribed threshold value Bk, and does not execute the adjustment cancellation operation if the adjustment amount Bi is less than the threshold value Bk. However, the inclination control device 81 may also be configured to execute the adjustment cancellation operation regardless of the magnitude of the adjustment amount Bi.

If the adjustment operation during lowering is performed, the holding section 30 may be inclined due to the adjustment amount Bi of the target belt when the holding section 30 is raised to the travel position P1. However, by performing the adjustment cancellation operation described above, the adjustment amount Bi of the target belt in the adjustment operation during lowering can be undone before the travel section 25 starts traveling. For this reason, it is possible to prevent the travel section 25 from traveling while the article W held by the holding section 30 is inclined. The adjustment cancellation operation described above may be performed while the holding section 30 is being raised for transfer. Alternatively, the adjustment cancellation operation may be performed after the raising of the holding section 30 is complete and the holding section 30 has reached the travel position P1. That is, it is sufficient that the above-mentioned adjustment cancellation operation is performed before the inclination control device 81 starts traveling by the travel section 25.

If there are a plurality of transfer target locations 20 along the travel path 12 and the transfer position P2 is different in height with respect to each of the transfer target locations 20, the amount by which the holding section 30 is elevated by the elevating device 38 is also different. For this reason, the adjustment amount Bi of the belt and the respective transfer target locations 20 are also different. Even in such a case, according to the article transport vehicle 10, the adjustment amount Bi of the belt can be appropriately determined according to the different heights of the transfer position P2 through the adjustment operation during lowering. Also, according to the article transport vehicle 10, even if the amount by which the holding section 30 is elevated is different at each transfer target location 20, it is possible to prevent the traveling section 25 from traveling while the article W held by the holding section 30 is inclined, due to the above-described adjustment cancellation operation.

Second Embodiment

Figure 10:
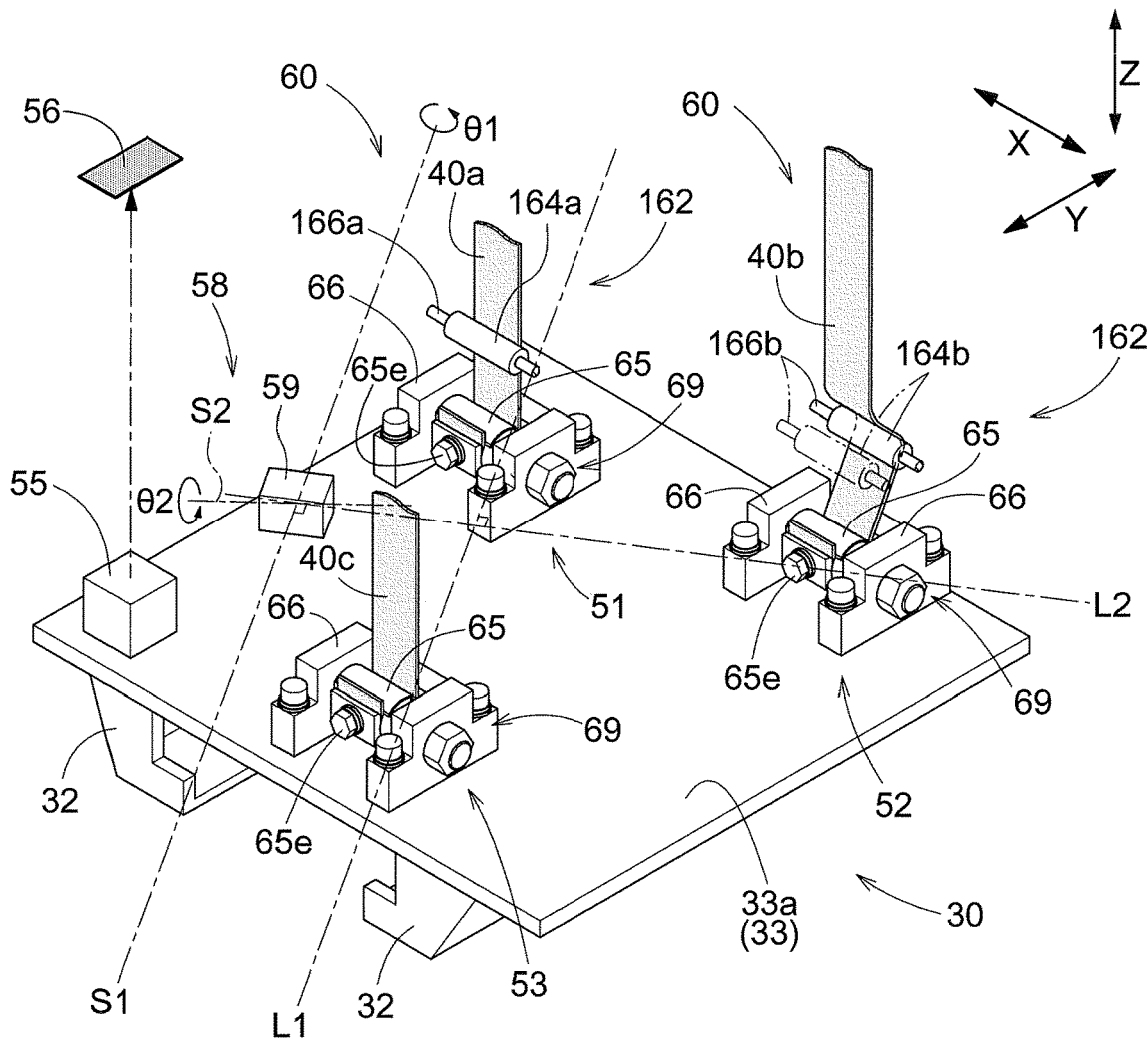
FIG. 10 is a perspective view showing a holding section of an article transport vehicle of the second embodiment.

A transport vehicle according to the second embodiment will be described below with reference to FIG. 10. The present embodiment differs from the first embodiment in that the inclination adjustment device 60 does not include the adjustment winding device 62, but includes an adjustment pulley driving device 162. Differences from the first embodiment will mainly be described below. Note that points that are not particularly described are the same as those in the first embodiment.

In this embodiment, the inclination adjustment device 60 includes the adjustment pulley driving device 162. The adjustment pulley driving device 162 includes adjustment pulleys 164a and 164b that are provided separately from the winding pulley 46 and are arranged so as to come into contact with the target belt, and adjustment driving sections 166a and 166b that change the positions of the adjustment pulleys 164a and 164b in the pressing direction with respect to the target belt. In the example of FIG. 10, the first adjustment driving section 166a provided in the holding section 30 changes the position of the first adjustment pulley 164a in the width direction Y. Also, the second adjustment driving section 166b provided in the holding section 30 changes the position of the second adjustment pulley 164b in the width direction Y. As a result, the first adjustment pulley 164a provided in the holding section 30 is pressed in the width direction Y against the first belt 40a, which is the target belt on which the inclination adjustment device 60 acts, and the first belt 40a is bent. Also, the second adjustment pulley 164b provided in the holding section 30 is pressed in the width direction Y against the second belt 40b, which is the target belt on which the inclination adjustment device 60 acts, and the second belt 40b is bent. Due to the first belt 40a and the second belt 40b bending, the suspension height H by the first belt 40a and the second belt 40b increases, and the inclination Ti of the holding section 30 can be adjusted.

The direction of pressing by the adjustment pulleys 164a and 164b is not limited to the width direction Y, and may be, for example, the path longitudinal direction X, an oblique direction including a horizontal component, or the like. That is, any direction may be used as long as the suspension height H of the first belt 40a and the second belt 40b is increased and the inclination Ti of the holding section 30 can be adjusted. In this embodiment, the pressing amount of the adjustment pulleys 164a and 164b corresponds to the adjustment amount Bi of the target belt. The first adjustment driving section 166a and the second adjustment driving section 166b are configured to be able to change the positions of the first adjustment pulley 164a and the second adjustment pulley 164b by, for example, having actuators (not shown). In the illustrated example, since the inclination adjustment device 60 is provided in the holding section 30, maintenance and inspection of the inclination adjustment device 60 can be performed by replacing the holding section 30.

Third Embodiment

An article transport vehicle 10 according to the third embodiment will be described below with reference to FIG. 11. The present embodiment differs from the first embodiment in that the inclination adjustment device 60 does not include the adjustment winding device 62, but includes an adjustment pulley driving device 162. Differences from the first embodiment will mainly be described below. Note that points that are not particularly described are the same as those in the first embodiment.

The adjustment pulley driving device 162 includes adjustment pulleys 164a and 164b that are provided separately from the winding pulley 46 and are arranged so as to come into contact with the target belt, and adjustment driving sections 166a and 166b that change the positions of the adjustment pulleys 164a and 164b in the pressing direction with respect to the target belt. In the example of FIG. 11, the elevating device 38 includes a first conversion pulley 148a, a second conversion pulley 148b, and a third conversion pulley 148c on the unwinding path of the suspension belt 40. The first conversion pulley 148a, the second conversion pulley 148b, and the third conversion pulley 148c change the extending direction of the suspension belt 40 from the width direction Y to the vertical direction Z. The first adjustment pulley 164a is provided between the first winding pulley 46a and the first conversion pulley 148a. The second adjustment pulley 164b is provided between the second winding pulley 46b and the second conversion pulley 148b.

The first adjustment driving section 166a provided in the travel section 25 moves the first adjustment pulley 164a in the vertical direction Z, whereby the first belt 40a bends and the suspension height H of the first belt 40a increases. Also, the second adjustment driving section 166b provided in the travel section 25 moves the second adjustment pulley 164b in the vertical direction Z, whereby the second belt 40b bends and the suspension height H of the second belt 40b increases. For this reason, the inclination Ti of the holding section 30 can be adjusted. Note that the pressing direction by the adjustment pulleys 164a and 164b is not limited to the vertical direction Z, and need only be a direction in which the suspension height H by the first belt 40a and the second belt 40b increases and the inclination Ti of the holding section 30 can be adjusted. In this embodiment, the pressing amount of the adjustment pulleys 164a and 164b corresponds to the adjustment amount Bi of the target belt.

Figure 11:
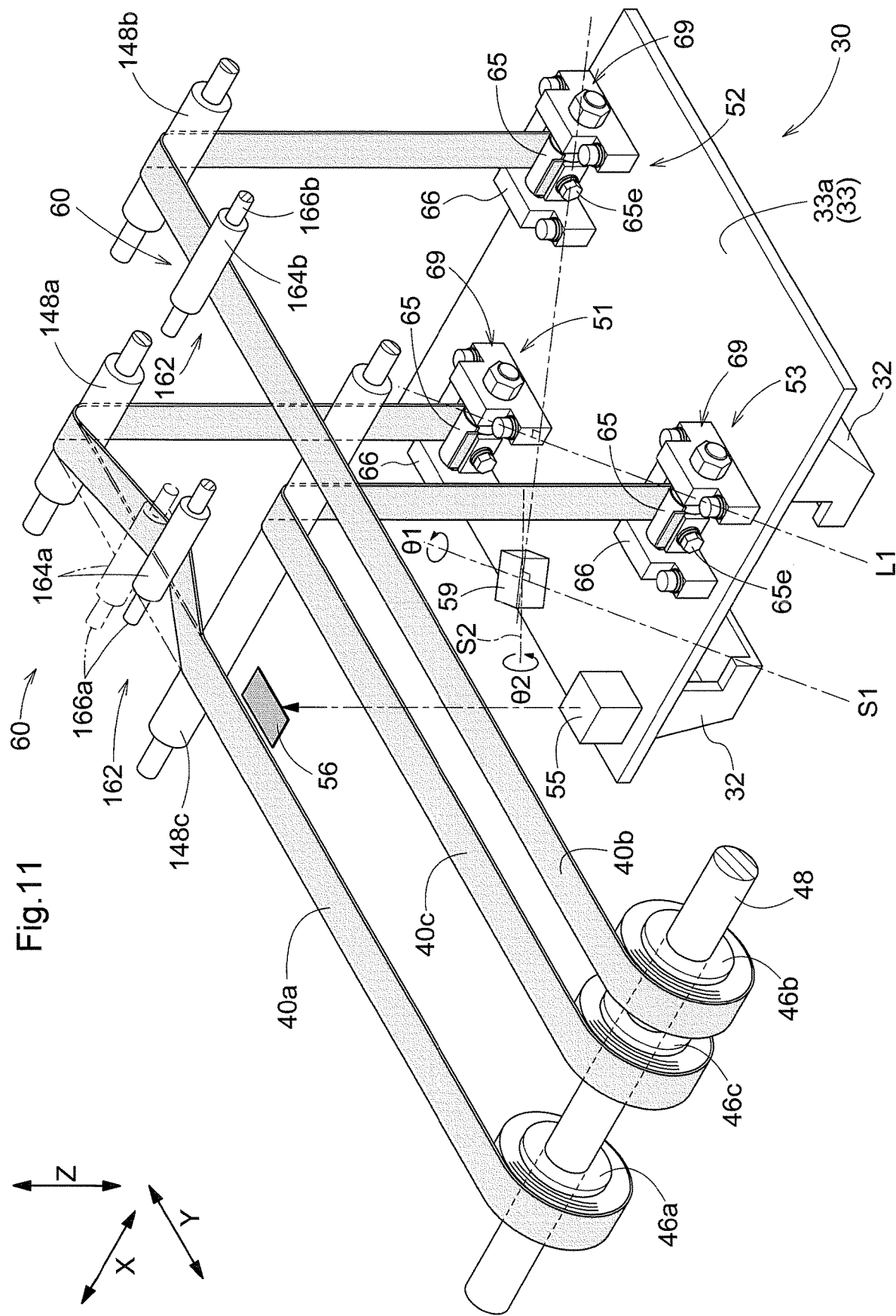
FIG. 11 is a perspective view showing a holding section of an article transport vehicle of a third embodiment.

As shown in FIG. 11, the winding driving section 47 (see FIG. 2) includes a winding driving shaft 48. The winding driving section 47 drives each of the first winding pulley 46a, the second winding pulley 46b, and the third winding pulley 46c, which are the plurality of winding pulleys 46, so as to rotate, by rotating the winding driving shaft 48. A first belt 40a, a second belt 40b, and a third belt 40c are wound around the third conversion pulley 148c. Also, the third conversion pulley 148c is provided between the first adjustment pulley 164a and second adjustment pulley 164b, and the winding driving shaft 48 (the winding driving section 47). For this reason, even if the first belt 40a and the second belt 40b receive a pressing load by the first adjustment pulley 164a and the second adjustment pulley 164b on the winding driving section 47 side relative to the first conversion pulley 148a and the second conversion pulley 148b, respectively, it is possible to keep the direction of the load that the winding driving section 47 receives from the first belt 40a and the second belt 40b unchanged.

Fourth Embodiment

Hereinafter, an article transport vehicle 10 according to the fourth embodiment will be described with reference to FIG. 12. The present embodiment differs from the first embodiment in that the inclination adjustment device 60 does not include the adjustment winding device 62, but includes an adjustment pulley driving device 162. Differences from the first embodiment will mainly be described below. Note that points that are not particularly described are the same as those in the first embodiment.

The adjustment pulley driving device 162 includes adjustment pulleys 164a and 164b that are provided separately from the winding pulley 46 and are arranged so as to come into contact with the target belt, and adjustment driving sections 166a and 166b that change the positions of the adjustment pulleys 164a and 164b in the pressing direction with respect to the target belt.

Figure 12:
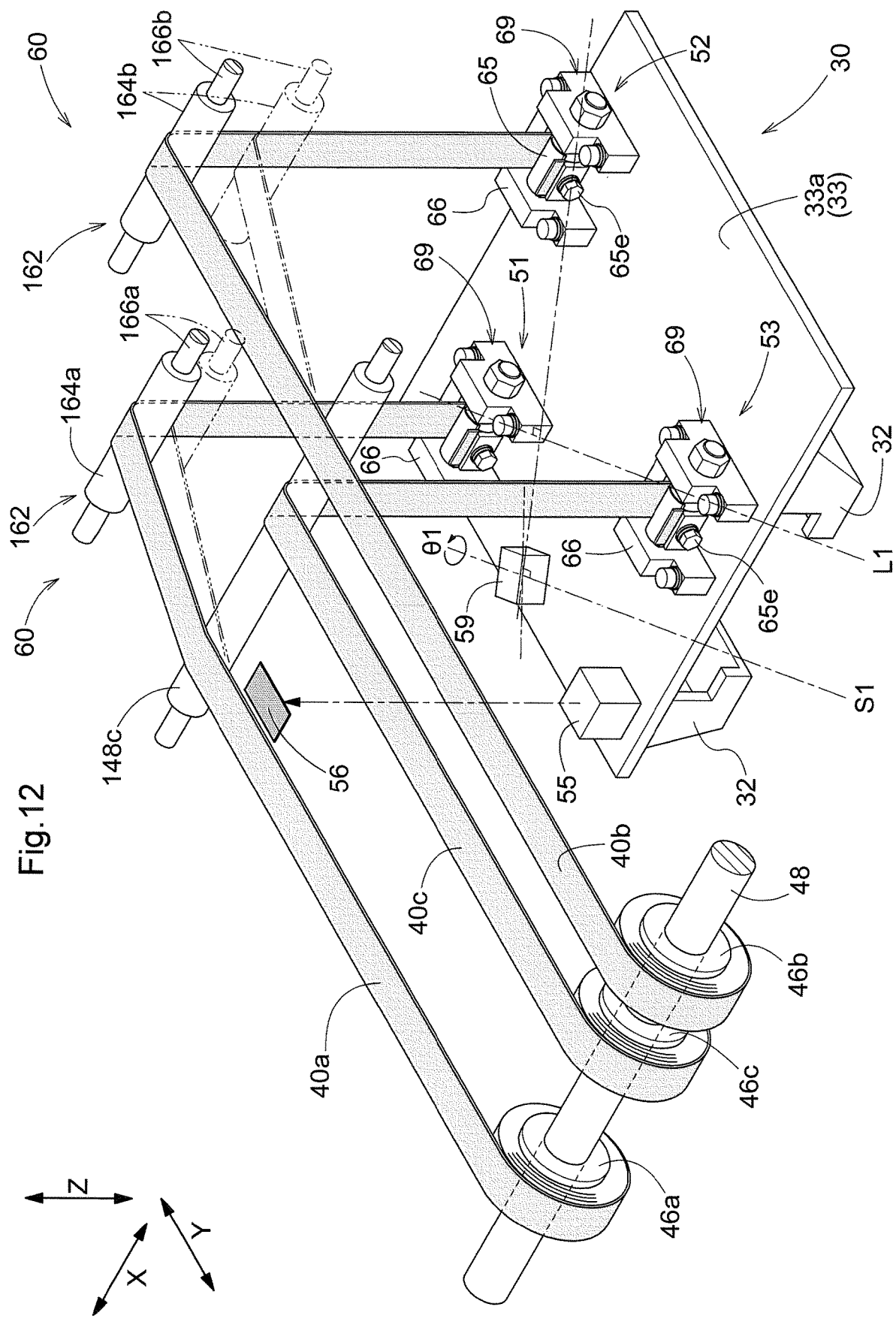
FIG. 12 is a perspective view showing a holding section of an article transport vehicle of a fourth embodiment.

In the example of FIG. 12, the first adjustment pulley 164a, which is the first conversion pulley provided on the unwinding path of the first belt 40a in the elevating device 38, is movable in the vertical direction Z. A second adjustment pulley 164b, which is a second conversion pulley provided on the feeding path of the second belt 40b in the elevating device 38, is movable in the vertical direction Z. The position of the first adjustment pulley 164a is changed in the vertical direction Z by the first adjustment driving section 166a. Also, the position of the second adjustment pulley 164b is changed in the vertical direction Z by the second adjustment driving section 166b. As a result, the length of the unwinding path of the first belt 40a can be changed by the first adjustment driving section 166a. Also, the length of the unwinding path of the second belt 40b can be changed by the second adjustment driving section 166b. Accordingly, the suspension height H by the first belt 40a and the second belt 40b can be changed, and the inclination Ti of the holding section 30 can be adjusted. In this embodiment, the pressing amount of the adjustment pulleys 164a and 164b corresponds to the adjustment amount Bi of the target belt.

Fifth Embodiment

Hereinafter, an article transport vehicle 10 according to the fifth embodiment will be described with reference to FIGS. 13 to 17. This embodiment differs from the first embodiment in that the inclination adjustment device 60 does not include the adjustment winding device 62, and a cam member 271 is provided between the belt support section 66 and the holding section 30. Differences from the first embodiment will mainly be described below. Note that points that are not particularly described are the same as those in the first embodiment.

Figure 13:
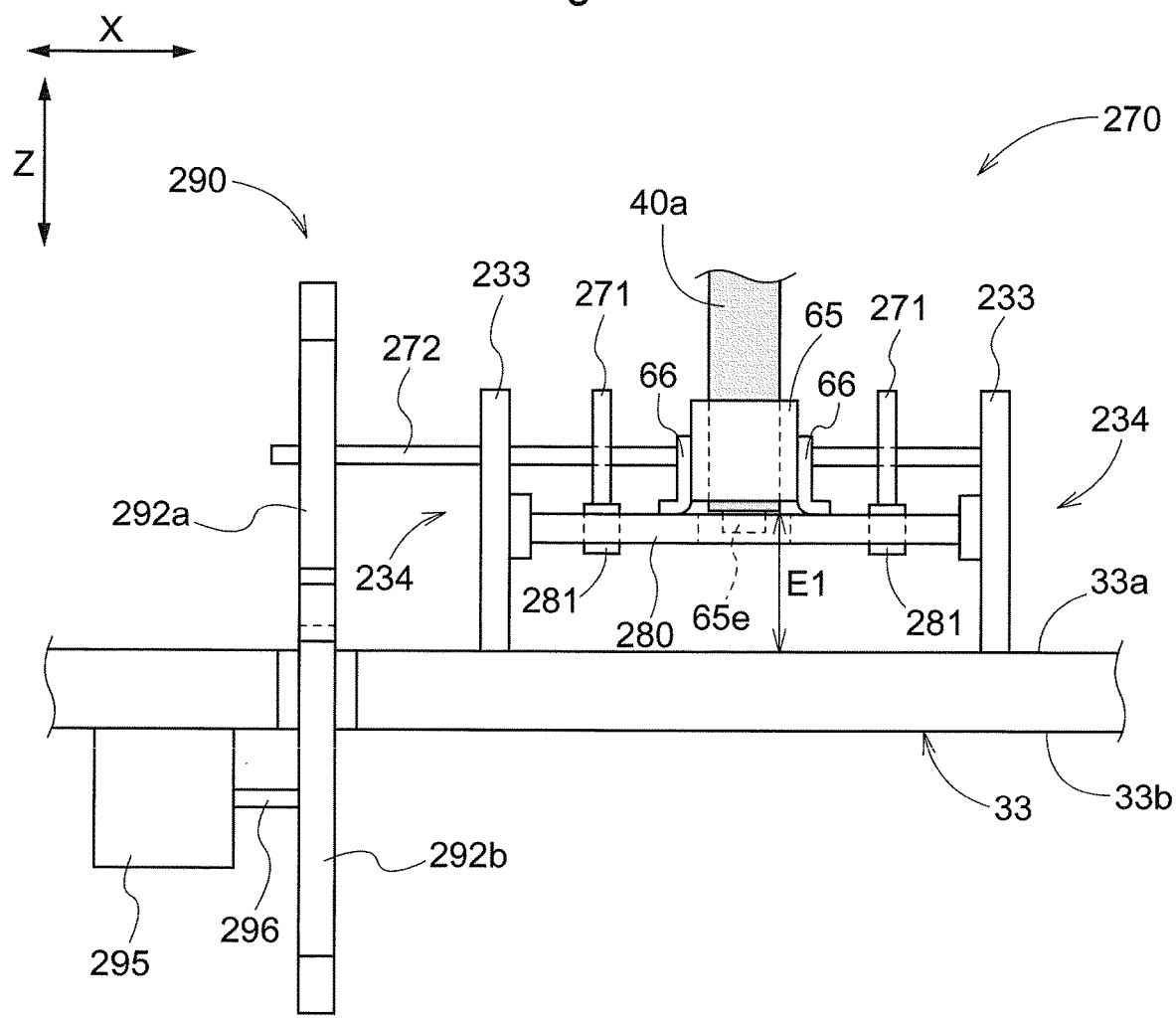
FIG. 13 is an enlarged front view showing an adjustment cam driving device of a fifth embodiment.

In the present embodiment, among the first belt 40a, the second belt 40b, and the third belt 40c, the first belt 40a and the second belt 40b are target belts on which the inclination adjustment device 60 acts. In the following, only the inclination adjustment device 60 that acts on the first belt 40a will be described, and since the inclination adjustment device 60 that acts on the second belt 40b is the same device, description thereof is omitted. FIG. 13 is a front view showing an enlarged adjustment cam driving device 270. Note that FIG. 13 shows a second state (FIG. 15), which will be described later.

In this embodiment, the inclination adjustment device 60 has an adjustment cam driving device 270. The adjustment cam driving device 270 includes a cam member 271 that rotates to change at least the distance E1 in the vertical direction Z between the holding section 30 and the first belt 40a, and a cam rotation driving section 290 that drives the cam member 271 so as to rotate. In the illustrated example, the cam member 271 is rotatably supported around the cam rotation driving shaft 272 by a cam support member 233 protruding upward from the base section 33. Also, the cam member 271 is supported by the cam support member 233 so as not to be movable in the vertical direction Z with respect to the base section 33 of the holding section 30.

In this embodiment, the adjustment cam driving device 270 includes a cam follower 280 connected to the first belt 40a, which is the target belt. The cam follower 280 moves reciprocally at least in the vertical direction Z according to the rotation of the cam member 271 around the cam rotation driving shaft 272, whereby at least the distance E1 in the vertical direction Z between the holding section 30 and the first belt 40a, which is the target belt, is changed. In the illustrated example, the distance E1 in the vertical direction Z is indicated by the distance between the upper surface 33a of the holding section 30 and the lower end of the first belt 40a, which is the target belt. Also, in the illustrated example, the cam follower 280 includes a roller 281 at a location that comes into contact with the cam member 271. Also, the cam follower 280 is fixed to the belt support section 66. Also, the cam member 271 is in contact with the cam follower 280 (here, the roller 281) from above, and the cam member 271 is always biased to the roller 281 of the cam follower 280 by the weight of the holding section 30. Accordingly, the holding section 30 is supported by the first belt 40a via the roller 281 of the cam follower 280. In the illustrated example, the cam follower 280 is a plate-shaped member having a roller 281 and has a through hole 280f for tightening and loosening the belt fixing bolt 65e.

Figure 14:
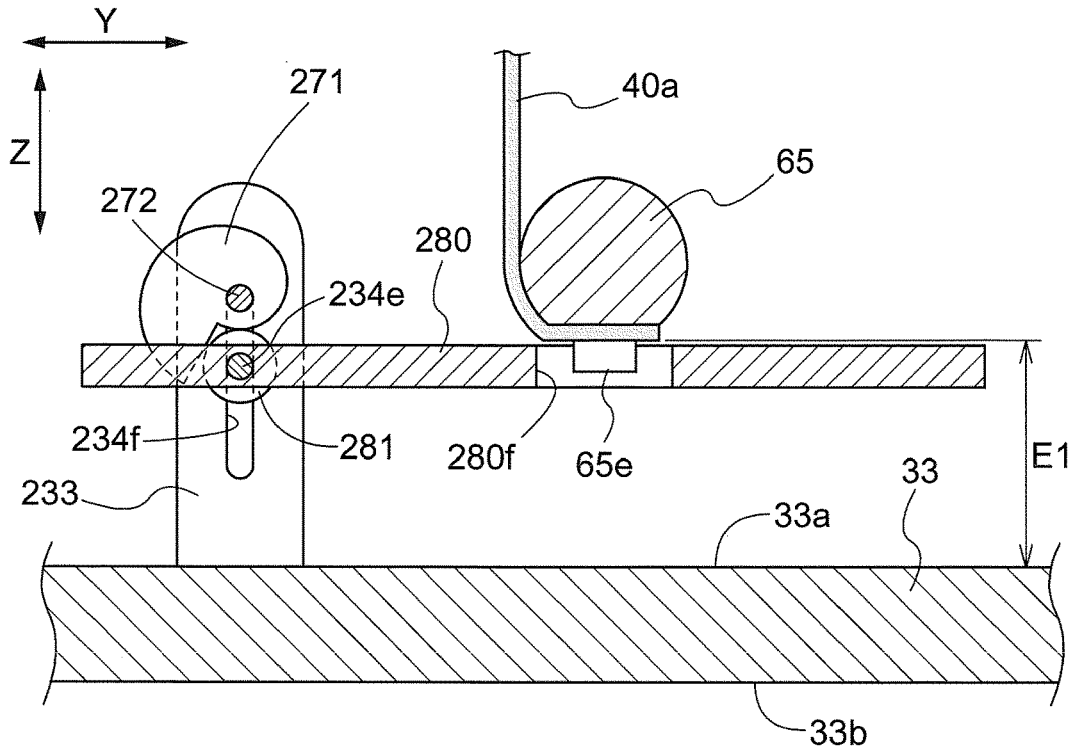
FIG. 14 is a lateral cross-sectional view of the adjustment cam driving device of the fifth embodiment, showing a first state.
Figure 15:
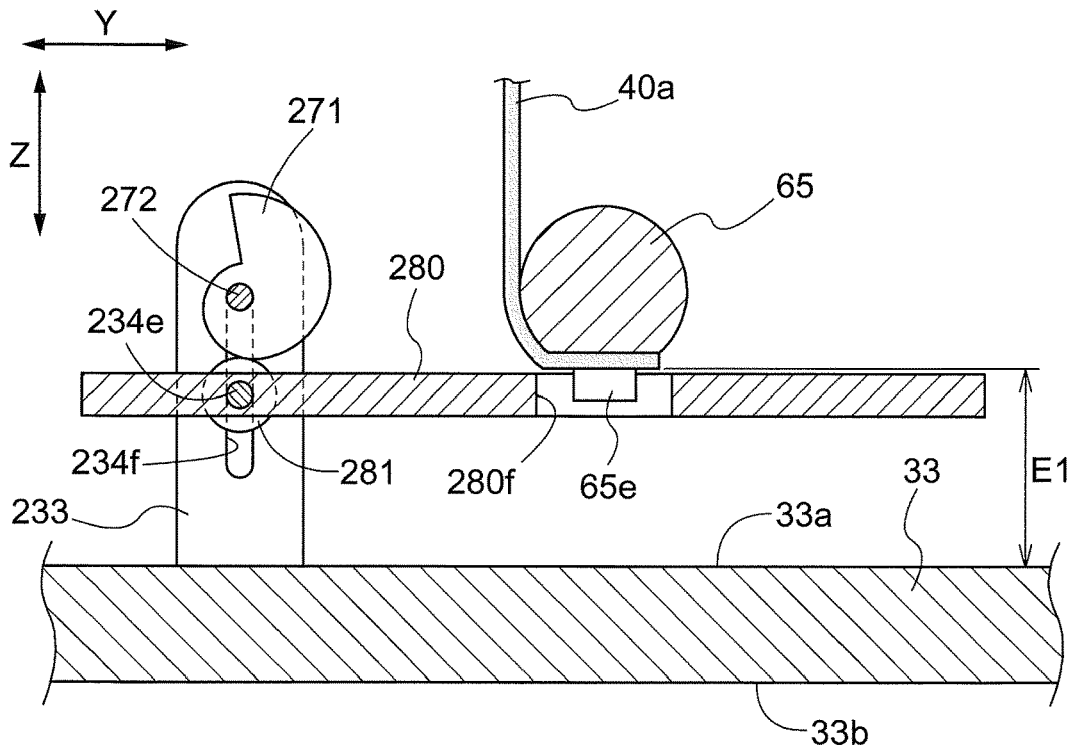
FIG. 15 is a lateral cross-sectional view of the adjustment cam driving device of the fifth embodiment, showing a second state.
Figure 16:
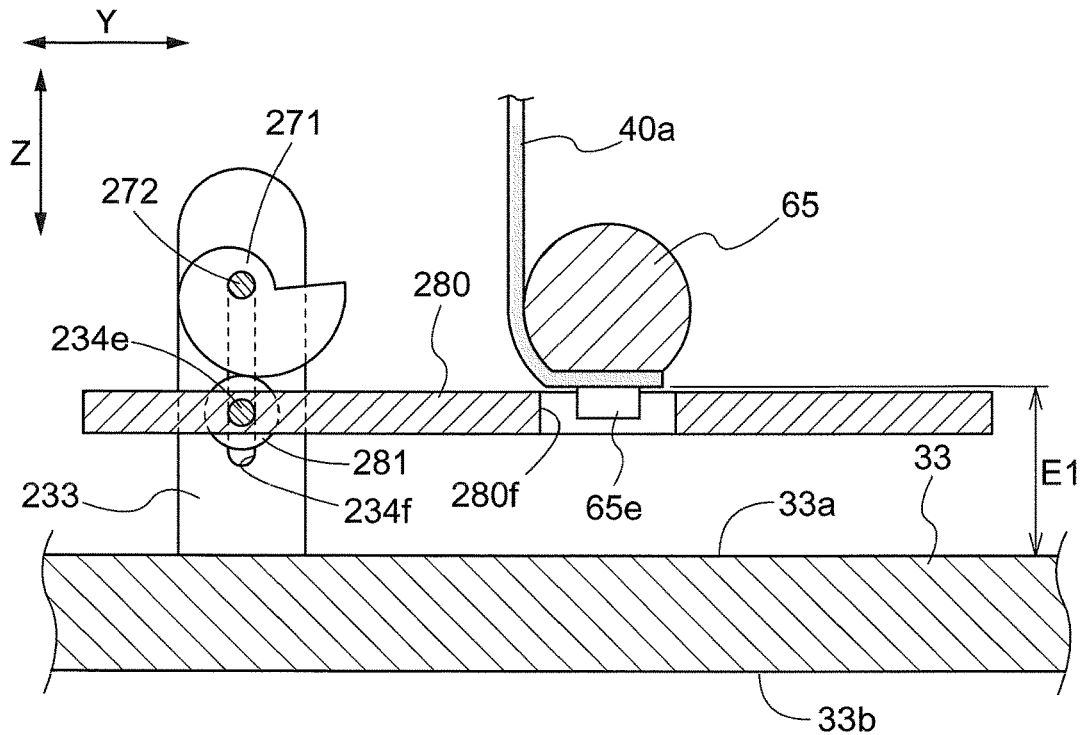
FIG. 16 is a lateral cross-sectional view of the adjustment cam driving device of the fifth embodiment, showing a third state.
Figure 17:
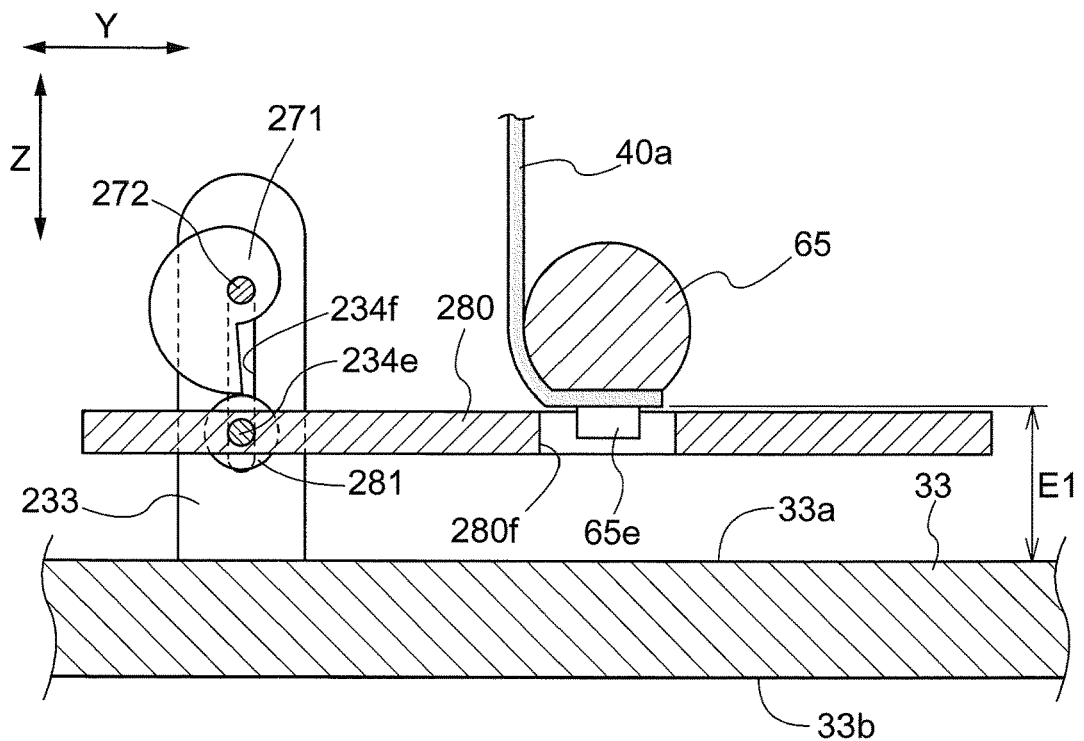
FIG. 17 is a lateral cross-sectional view of the adjustment cam driving device of the fifth embodiment, showing a fourth state.

FIGS. 14 to 17 are side views of the adjustment cam driving device 270 of this embodiment. In FIGS. 14 to 17, the belt support section 66 is omitted. FIG. 14 shows a first state in which the distance E1 in the vertical direction Z between the holding section 30 and the first belt 40a is the longest. FIG. 15 shows a second state in which the cam member 271 has rotated clockwise about 180 degrees from the first state. FIG. 16 shows a third state in which the cam member 271 has rotated clockwise about 90 degrees from the second state. FIG. 17 shows a fourth state in which the cam member 271 has rotated clockwise about 90 degrees from the third state and the distance E1 is the shortest. According to the adjustment cam driving device 270 of the present embodiment, the suspension height H can be adjusted by changing the distance E1 in the vertical direction Z between the holding section 30 and the first belt 40a, and the inclination Ti of the holding section 30 can be appropriately adjusted. In the present embodiment, the amount of change in the distance E1 in the vertical direction Z between the holding section 30 and the target belts (the first belt 40a and the second belt 40b) corresponds to the adjustment amount Bi of the target belts.

As shown in FIG. 15, in the present embodiment, the adjustment cam driving device 270 includes a linear motion guide section 234 that guides the cam follower 280 in the vertical direction Z. The direct acting guide section 234 includes a guide pin 234e and a guide hole 234f. In the illustrated example, the guide pin 234e is provided in the cam follower 280 and the guide hole 234f is provided in the cam support member 233.

Returning to FIG. 13, in the present embodiment, the cam rotation driving section 290 includes a cam motor 295 and a transmission mechanism 292 that transmits the driving force of the cam motor 295 to the cam member 271. Also, a cam member 271 is arranged on the upper surface 33a side of the base section 33 of the holding section 30, and a cam motor 295 is arranged on the lower surface 33b side of the base section 33. In this manner, the lower surface 33b side of the base section 33, which tends to be unused space, can be effectively used, and it is easy to suppress an increase in the size of the holding section 30 due to the adjustment cam driving device 270 being included.

In the illustrated example, the transmission mechanism 292 includes a first gear 272a that rotates integrally with the cam rotation driving shaft 272, and a second gear 272b that rotates integrally with the driving shaft 296 of the cam motor 295. In this manner, for example, by changing the diameter of the first gear 272a or the second gear 272b, the distance in the vertical direction Z between the cam member 271 and the cam motor 295 can be set to any distance. Also, for example, by forming the first gear 272a and the second gear 272b as intersecting gears, the arrangement angle of the cam motor 295 can be set in any direction.

Other Embodiments

Next, another embodiment of the article transport vehicle 10 will be described.

(1) In the above embodiment, as an example, a configuration was described in which the inclination Ti of the holding section 30 is adjusted such that the upper surface 33a, which is the reference surface, is horizontal. However, without being limited to such an example, for example, the inclination Ti of the holding section 30 may be adjusted such that the pair of gripping claws 32 of the holding section 30 are horizontally aligned. Also, when the upper surface of the support platform 22, which is the article placement surface of the transfer target location 20, is an inclined surface, or the like, the inclination Ti may be adjusted such that the holding section 30 is similarly inclined. Also, a slide mechanism for sliding the holding section 30 in the horizontal direction with respect to the travel section 25 may be provided in the article transport vehicle 10, and the inclination of the holding section 30 according to the protrusion of the holding section 30 in the horizontal direction with respect to the travel section 25 may be adjusted through the adjusting operation during lowering.

(2) In the above-described embodiment, as an example, a configuration was described in which the initial movement segment D1, the acceleration segment D2, the maximum speed segment D3, the first deceleration segment D4, the intermediate segment D5, the second deceleration segment D6, the pre-stop segment D7, and the like are provided. However, there is no limitation to such an example, and for example, only the acceleration segment D2 may be provided and the adjustment operation during lowering may be performed. Also, when the distance from the travel position P1 to the transfer position P2 is short, when the lowering speed Vd is slow, or the like, only the measurement segment Dt in which the holding section 30 is lowered at the constant measurement speed Vt after the start of lowering may be set, and the adjustment operation during lowering may be executed.

(3) In the above embodiment, the inclination control device 81 causes the inclination detection device 58 to detect the inclination Ti while the holding section 30 is being lowered. However, there is no limitation to such an example, and for example, the inclination Ti may not be detected during each lowering. For example, a plurality of inclinations Ti of a plurality of transfer target locations 20 may be learned during lowering of each transfer target location 20, and the adjustment operation during lowering may be performed based on the learning results.

(4) In the above embodiment, as an example, a configuration was described in which the suspension belts 40 are three belts, namely, the first belt 40a, the second belt 40b, and the third belt 40c, but it is sufficient that there are a plurality of suspension belts 40, and for example, there may be two suspension belts 40. Also, the arrangement of the first connection section 51, the second connection section 52, the third connection section 53, and the inclination sensor 59 is held in common with the first to fifth embodiments, but there is no limitation thereto, and it is sufficient that arrangement is performed according to the number of the suspension belts 40 and the connecting points. Also, in the above-described embodiment, the number of target belts on which the inclination adjustment device 60 acts was two, namely, the first belt 40a and the second belt 40b, but the target belt may be only one of them.

(5) In the above-described embodiment, as an example, a configuration was described in which the inclination adjustment device 60 includes one of the adjustment winding device 62, the adjustment pulley driving device 162, and the adjustment cam driving device 270. However, there is no limitation to such an example, and for example, it is possible to use a configuration including all of the adjustment winding device 62, the adjustment pulley driving device 162, and the adjustment cam driving device 270, or a configuration including any two of them.

(6) In the first, second, and fifth embodiments, as an example, a configuration was described in which the height detection sensor 55, the inclination detection device 58, the inclination adjustment device 60, and the inclination control device 81 are mounted on the holding section 30. However, there is no limitation to such an example, and for example, the height detection sensor 55, the inclination detection device 58, the inclination adjustment device 60, and the inclination control device 81 may be provided in the travel section 25. Also, for example, if the inclination control device 81 includes a plurality of pieces of hardware that are separated so as to be able to communicate with each other, some of the hardware may be mounted on the holding section 30 and the rest of the hardware may be provided in an external control that is not mounted on the holding section 30. Also, for example, the inclination control device 81 and the elevation control device 82 may be one control device instead of separate control devices.

(7) In the fifth embodiment, as an example, a configuration was described in which the cam member 271 is always biased to the cam follower 280 by the weight of the holding section 30. However, there is no limitation to such an example, and for example, it is also possible to use a configuration in which the cam member 271 is always biased to the cam follower 280 by an elastic member. Alternatively, the cam member 271 and the cam motor 295 may be connected to the first belt 40*a*, and the cam follower 280 may be supported on the base section 33 of the holding section 30 so as not to be movable in the vertical direction Z.

(8) Note that the configurations disclosed in the above-described embodiments can also be applied in combination with configurations disclosed in other embodiments as long as there is no contradiction. Regarding other configurations as well, the embodiments disclosed in this specification are merely examples in all respects. Accordingly, various modifications can be made as appropriate without departing from the gist of the present disclosure.

Overview of the Embodiments

The article transport vehicle described above will be described below.

The article transport vehicle according to the present disclosure is an article transport vehicle configured to transport an article, the article transport vehicle including: a travel section configured to travel along a travel route; a holding section configured to hold the article; an elevating device configured to raise the holding section to a travel position for traveling along the travel route and lower the holding section to a transfer position for transferring the article between a transfer target location and the holding section, by winding and unwinding a plurality of suspension belts while the holding section is suspended by the plurality of suspension belts; an inclination detection device configured to detect inclination of the holding section with respect to a horizontal plane; an inclination adjustment device configured to adjust the inclination of the holding section; and an inclination control device configured to control the inclination adjustment device, in which the inclination adjustment device is configured to adjust the inclination of the holding section by acting on at least one target belt among the plurality of suspension belts to adjust a suspension height at which the holding section is suspended by the at least one target belt, and the inclination control device executes an adjustment operation during lowering, in which, during lowering of the holding section to the transfer position by the elevating device, the inclination of the holding section is detected by the inclination detection device, and based on the result of the detection performed by the inclination detection device, the inclination adjustment device is controlled to adjust the inclination of the holding section.

According to this configuration, since the inclination of the holding section is adjusted while the holding section is being lowered, even if the inclination of the holding section changes according to the winding and unwinding of the suspension belts, the orientation of the holding section can be appropriately adjusted. Also, even if there are a plurality of transfer target locations along the travel route and the height of the transfer position with respect to each transfer target location differs, the inclination of the holding section can be appropriately adjusted according to the height of the transfer position. Alternatively, even if the inclination of the holding section changes due to aging of the suspension belts or change in the usage environment, the orientation of the holding section can be appropriately adjusted according to the change. Furthermore, according to this configuration, since the inclination of the holding section is adjusted by the inclination adjustment device while the holding section is being lowered, the time required for the transfer operation of the article can be shortened.

As one aspect, it is preferable that in the adjustment operation during lowering, the inclination control device (i) causes the inclination detection device to detect the inclination of the holding section a plurality of times in a measurement segment in which the holding section is lowered at a measurement speed that is a constant speed lower than a maximum lowering speed, which is a maximum speed of the holding section during lowering to the transfer position, and (ii) controls the inclination adjustment device to adjust the inclination of the holding section based on results of the detection performed a plurality of times.

According to this configuration, since the inclination detection device detects the inclination of the holding section while the speed is maintained at a constant speed, it is possible to avoid an increase in error in the detection result of the inclination of the holding section due to the influence of acceleration. Error can also be reduced by using the average value of a plurality of detection results.

As one aspect, it is preferable that the article transport vehicle further includes an elevation control device configured to control the elevating device, in which the elevation control device is configured to execute stepwise deceleration control in which a lowering speed of the holding section during lowering to the transfer position is reduced from the maximum lowering speed to an intermediate lowering speed in a first deceleration segment after a maximum speed segment for lowering at the maximum lowering speed, then the intermediate speed is maintained in an intermediate segment, then the lowering speed is reduced from the intermediate speed to a pre-stop speed in a second deceleration segment, then the pre-stop speed is maintained in a pre-stop segment, and then the holding section is stopped at a suspension height corresponding to the transfer location, and the measurement segment is within the intermediate segment.

If the inclination of the holding section changes according to the height of the holding section due to variations in the thickness of the suspension belts or the like, when the inclination of the holding section is detected a plurality of times during high-speed lifting, changes in the inclination according to the suspension height of the holding section will have more of an influence. According to this configuration, since the inclination of the holding section is detected during lowering at a measurement speed that is lower than the maximum lowering speed, even if detection is performed a plurality of times, changes in the inclination according to the suspension height of the holding section can have less of an influence. Accordingly, it is easy to detect the inclination of the holding section with high accuracy.

As one aspect, it is preferable that at a time that is during raising of the holding section to the travel position or after completion of raising of the holding section and is before travel by the travel section is started, the inclination control device executes an adjustment cancellation operation for undoing an adjustment amount of the at least one target belt in the adjustment operation during lowering by the inclination adjustment device.

When the holding section is raised to the travel position, the holding section may be inclined due to the adjustment amount of the target belt in the adjustment operation during lowering. According to this configuration, the adjustment amount of the target belt in the adjustment operation during lowering can be undone before the travel section starts traveling. For this reason, it is possible to prevent the travel section from traveling while the article held by the holding section is inclined.

As one aspect, it is preferable that the inclination control device executes the adjustment cancellation operation in response to the adjustment amount being a predetermined threshold value or more, and does not execute the adjustment cancellation operation in response to the adjustment amount being less than the threshold value.

According to this configuration, if the adjustment amount of the target belt in the adjustment operation during lowering is small, it is conceivable that the inclination of the article held by the holding section is also small when the holding section is at the travel position. According to this configuration, since the adjustment cancellation operation is not executed in such a case, unnecessary execution of the adjustment cancellation operation can be avoided, and consequently, it is easier for the travel section to start traveling right away.

As one aspect, it is preferable that the inclination detection device includes an inclination sensor attached to the holding section.

According to this configuration, it is easy to detect the inclination of the holding section with high accuracy.

As one aspect, it is preferable that the inclination sensor is configured to detect an inclination angle about a first detection axis, and an inclination angle about a second detection axis orthogonal to the first detection axis, the plurality of suspension belts include a first belt, a second belt, and a third belt that are respectively connected to mutually different parts of the holding section, the at least one target belt includes the first belt and the second belt, and with a section connecting the first belt and the holding section being a first connection section, a section connecting the second belt and the holding section being a second connection section, and a section connecting the third belt and the holding section being a third connection section, and with a virtual line connecting the first connection section and the third connection section being a first virtual line, and a virtual line that passes through the second connection section and is orthogonal to the first virtual line being a second virtual line, the inclination sensor is oriented in such a manner that either the first detection axis or the second detection axis overlaps with the second virtual line in a view in a vertical direction.

According to this configuration, it is possible to simplify the arithmetic processing for obtaining the inclination angle of the holding section based on the detection result of the inclination sensor when the inclination sensor that detects the inclination angles of two axes is used.

As one aspect, it is preferable to further include an elevation detection device configured to detect whether or not the holding section is being lowered to the transfer location, in which the elevation detection device, the inclination detection device, the inclination adjustment device, and the inclination control device are mounted on the holding section.

According to this configuration, the inclination adjustment device mounted on the holding section can adjust the inclination of the holding section due to being controlled based on the detection results of the elevation detection device and the inclination detection device mounted on the holding section. That is, it is possible to complete the adjustment operation during lowering with use of a device mounted on the holding section. For this reason, it is possible to reduce communication between the holding section and a section other than the holding section.

As one aspect, it is preferable that the elevating device includes: a plurality of winding pulleys around which the plurality of suspension belts are respectively wound; and a winding driving section configured to drive the plurality of winding pulleys to rotate, and the elevating device is configured to lower the holding section by unwinding the suspension belts from the plurality of winding pulleys and raise the holding section by winding the suspension belts around the winding pulleys, and the inclination adjustment device includes at least one of an adjustment winding device that is provided separately from the winding pulleys and is configured to wind and unwind the at least one target belt, an adjustment pulley driving device including: an adjustment pulley that is provided separately from the winding pulleys and is arranged in such a manner as to come into contact with the at least one target belt; and an adjustment driving section configured to change a position of the adjustment pulley in a pushing direction with respect to the at least one target belt, or an adjustment cam driving device including: a cam member configured to change a distance in at least a vertical direction between the holding section and the at least one target belt by being driven to rotate; and a cam rotation driving section configured to drive the cam member to rotate.

According to this configuration, it is possible to adjust the suspension height of the holding section with use of the target belt by acting on the target belt, and to appropriately adjust the inclination of the holding section.

As one aspect, it is preferable that the elevating device includes: a plurality of winding pulleys around which the plurality of suspension belts are respectively wound; and a winding driving section configured to drive the plurality of winding pulleys to rotate, the elevating device is configured to lower the holding section by unwinding the suspension belts from the plurality of winding pulleys and raise the holding section by winding the suspension belts around the winding pulleys, the inclination adjustment device includes an adjustment cam driving device, the adjustment cam driving device includes: a cam member configured to change a distance in at least a vertical direction between the holding section and the at least one target belt by being driven to rotate; and a cam rotation driving section configured to drive the cam member to rotate, the cam rotation driving section includes: a cam motor; and a transmission mechanism configured to transmit a driving force of the cam motor to the cam member, the holding section includes a base section, the cam member is arranged on an upper surface of the base section, and the cam motor is arranged on a lower surface of the base section.

According to this configuration, it is possible to effectively use the lower surface side of the base section, which tends to be an unused space, and it is easy to suppress an increase in size of the holding section due to the provision of the adjustment cam driving device.

Industrial Applicability

The technique according to the present disclosure can be used in an article transport vehicle including an elevating device that raises and lowers a holding section holding an article in a suspended state.

What is claimed is:

1. An article transport vehicle configured to transport an article, the article transport vehicle comprising:
   a travel section configured to travel along a travel route;
   a holding section configured to hold the article;
   an elevating device configured to raise the holding section to a travel position for traveling along the travel route and lower the holding section to a transfer position for transferring the article between a transfer target location and the holding section, by winding and unwinding a plurality of suspension belts while the holding section is suspended by the plurality of suspension belts;
   an inclination detection device configured to detect inclination of the holding section with respect to a horizontal plane;
   an inclination adjustment device configured to adjust the inclination of the holding section; and
   an inclination control device configured to control the inclination adjustment device; and
   an elevation control device configured to control the elevating device,
   wherein the inclination adjustment device is configured to adjust the inclination of the holding section by acting on at least one target belt among the plurality of suspension belts to adjust a suspension height at which the holding section is suspended by the at least one target belt, and
   wherein the inclination control device executes an adjustment operation during lowering, in which, during lowering of the holding section to the transfer position by the elevating device, the inclination of the holding section is detected by the inclination detection device, and based on a result of the detection performed by the inclination detection device, the inclination adjustment device is controlled to adjust the inclination of the holding section, and
   wherein, in the adjustment operation during lowering:
      the elevation control device controls the elevating device to lower the holding section at a measurement speed, the measurement speed is a constant speed that is lower than a maximum lowering speed, and the maximum lowering speed is a maximum speed of the holding section during lowering to the transfer position;
      the inclination control device controls the inclination detection device to detect the inclination of the holding section a plurality of times in a measurement segment in which the elevation control device controls the elevating device to lower the holding section at the measurement speed.

2. The article transport vehicle according to claim 1, wherein the elevation control device is configured to execute stepwise deceleration control in which a lowering speed of the holding section during lowering to the transfer position is reduced from the maximum lowering speed to an intermediate lowering speed in a first deceleration segment after a maximum speed segment for lowering at the maximum lowering speed, then the intermediate speed is maintained in an intermediate segment, then the lowering speed is reduced from the intermediate speed to a pre-stop speed in a second deceleration segment, then the pre-stop speed is maintained in a pre-stop segment, and then the holding section is stopped at a suspension height corresponding to the transfer location, and
wherein the measurement segment is within the intermediate segment.

3. The article transport vehicle according to claim 1, wherein the inclination detection device comprises an inclination sensor attached to the holding section.

4. The article transport vehicle according to claim 3, wherein:
   the inclination sensor is configured to detect an inclination angle about a first detection axis and an inclination angle about a second detection axis orthogonal to the first detection axis,
   the plurality of suspension belts comprise a first belt, a second belt, and a third belt that are respectively connected to mutually different parts of the holding section,
   the at least one target belt comprises the first belt and the second belt, and
   wherein with:
   a section connecting the first belt and the holding section being a first connection section,
   a section connecting the second belt and the holding section being a second connection section, and
   a section connecting the third belt and the holding section being a third connection section, and
   a virtual line connecting the first connection section and the third connection section being a first virtual line, and
   a virtual line that passes through the second connection section and is orthogonal to the first virtual line being a second virtual line, then:
   the inclination sensor is oriented in such a manner that either the first detection axis or the second detection axis coincides with the second virtual line in a view in a vertical direction.

5. The article transport vehicle according to claim 4, wherein the inclination sensor is oriented to coincide with at least one of the first detection axis and the second detection axis in a view in a vertical direction.

6. The article transport vehicle according to claim 1, further comprising
   an elevation detection device configured to detect whether or not the holding section is being lowered to the transfer location, and wherein the elevation detection device, the inclination detection device, the inclination adjustment device, and the inclination control device are mounted on the holding section.

7. The article transport vehicle according to claim 1, wherein the elevating device comprises:
   a plurality of winding pulleys around which the plurality of suspension belts are respectively wound; and
   a winding driving section configured to drive the plurality of winding pulleys to rotate, and
   wherein the elevating device is configured to lower the holding section by unwinding the suspension belts from the plurality of winding pulleys and raise the holding section by winding the suspension belts around the winding pulleys, and
   wherein the inclination adjustment device comprises at least one of:
   an adjustment winding device that is provided separately from the winding pulleys and is configured to wind and unwind the at least one target belt,
   an adjustment pulley driving device comprising:
      an adjustment pulley that is provided separately from the winding pulleys and is arranged in such a manner as to come into contact with the at least one target belt; and
      an adjustment driving section configured to change a position of the adjustment pulley in a pushing direction with respect to the at least one target belt, or
   an adjustment cam driving device comprising:
      a cam member configured to change a distance in at least a vertical direction between the holding section and the at least one target belt by being driven to rotate; and
      a cam rotation driving section configured to drive the cam member to rotate.

8. The article transport vehicle according to claim 1, wherein, in the adjustment operation during lowering:
   the inclination control device receives results of the detection performed a plurality of times in the measurement segment; and
   based on the results of the detection performed a plurality of times in the measurement segment, the inclination control device controls the inclination adjustment device to adjust the inclination of the holding section while the elevation control device controls the elevating device to lower the holding section.

9. The article transport vehicle according to claim 1, wherein, in the adjustment operation during lowering:
   the inclination control device receives results of the detection performed a plurality of times in the measurement segment; and
   based on the results of the detection performed a plurality of times in the measurement segment, the inclination control device controls the inclination adjustment device to adjust the inclination of the holding section while the elevation control device controls the elevating device to lower the holding section at the measurement speed.

10. An article transport vehicle configured to transport an article, the article transport vehicle comprising:
    a travel section configured to travel along a travel route;
    a holding section configured to hold the article;
    an elevating device configured to raise the holding section to a travel position for traveling along the travel route and lower the holding section to a transfer position for transferring the article between a transfer target location and the holding section, by winding and unwinding a plurality of suspension belts while the holding section is suspended by the plurality of suspension belts;
    an inclination detection device configured to detect inclination of the holding section with respect to a horizontal plane;
    an inclination adjustment device configured to adjust the inclination of the holding section; and
    an inclination control device configured to control the inclination adjustment device,
    wherein the inclination adjustment device is configured to adjust the inclination of the holding section by acting on at least one target belt among the plurality of suspension belts to adjust a suspension height at which the holding section is suspended by the at least one target belt,
    wherein the inclination control device executes an adjustment operation during lowering, in which, during lowering of the holding section to the transfer position by the elevating device, the inclination of the holding section is detected by the inclination detection device, and based on a result of the detection performed by the inclination detection device, the inclination adjustment device is controlled to adjust the inclination of the holding section, and
    wherein at a time that is during raising of the holding section to the travel position or after completion of raising of the holding section and is before travel by the travel section is started, the inclination control device executes an adjustment cancellation operation for undoing an adjustment amount of the at least one target belt in the adjustment operation during lowering by the inclination adjustment device.

11. The article transport vehicle according to claim 10, wherein the inclination control device executes the adjustment cancellation operation when the adjustment amount is a predetermined threshold value or more, and does not execute the adjustment cancellation operation when the adjustment amount is less than the threshold value.

12. An article transport vehicle configured to transport an article, the article transport vehicle comprising:
    a travel section configured to travel along a travel route;
    a holding section configured to hold the article;
    an elevating device configured to raise the holding section to a travel position for traveling along the travel route and lower the holding section to a transfer position for transferring the article between a transfer target location and the holding section, by winding and unwinding a plurality of suspension belts while the holding section is suspended by the plurality of suspension belts;
    an inclination detection device configured to detect inclination of the holding section with respect to a horizontal plane;
    an inclination adjustment device configured to adjust the inclination of the holding section; and
    an inclination control device configured to control the inclination adjustment device,
    wherein the inclination adjustment device is configured to adjust the inclination of the holding section by acting on at least one target belt among the plurality of suspension belts to adjust a suspension height at which the holding section is suspended by the at least one target belt,
    wherein the inclination control device executes an adjustment operation during lowering, in which, during lowering of the holding section to the transfer position by the elevating device, the inclination of the holding section is detected by the inclination detection device, and based on a result of the detection performed by the inclination detection device, the inclination adjustment device is controlled to adjust the inclination of the holding section, wherein the elevating device comprises:
- a plurality of winding pulleys around which the plurality of suspension belts are respectively wound; and
- a winding driving section configured to drive the plurality of winding pulleys to rotate, wherein the elevating device is configured to lower the holding section by unwinding the suspension belts from the plurality of winding pulleys and raise the holding section by winding the suspension belts around the winding pulleys, wherein the inclination adjustment device comprises an adjustment cam driving device, wherein the adjustment cam driving device comprises:
- a cam member configured to change a distance in at least a vertical direction between the holding section and the at least one target belt by being driven to rotate; and
- a cam rotation driving section configured to drive the cam member to rotate, wherein the cam rotation driving section comprises:
- a cam motor; and
- a transmission mechanism configured to transmit a driving force of the cam motor to the cam member, wherein the holding section comprises a base section, wherein the cam member is arranged on an upper surface of the base section, and wherein the cam motor is arranged on a lower surface of the base section.

* * * * *